(12) United States Patent
Kemen et al.

(10) Patent No.: US 10,354,831 B2
(45) Date of Patent: Jul. 16, 2019

(54) CHARGED PARTICLE INSPECTION METHOD AND CHARGED PARTICLE SYSTEM

(71) Applicants: Carl Zeiss Microscopy GmbH, Jena (DE); Applied Materials Israel, Ltd, Rehovot (IL)

(72) Inventors: Thomas Kemen, Meppen (DE); Rainer Knippelmeyer, Utting am Ammersee (DE); Stefan Schubert, Oberkochen (DE)

(73) Assignees: Carl Zeiss Microscopy GmbH, Jena (DE); Applied Materials Israel, Ltd, Rehovot (IL)

( * ) Notice: Subject to any disclaimer, the term of this patent is extended or adjusted under 35 U.S.C. 154(b) by 0 days.

(21) Appl. No.: 15/137,796

(22) Filed: Apr. 25, 2016

(65) Prior Publication Data
US 2016/0240344 A1    Aug. 18, 2016

Related U.S. Application Data

(60) Continuation of application No. 14/309,452, filed on Jun. 19, 2014, now Pat. No. 9,324,537, which is a
(Continued)

(51) Int. Cl.
*H01J 37/04* (2006.01)
*H01J 37/09* (2006.01)
(Continued)

(52) U.S. Cl.
CPC ............ *H01J 37/04* (2013.01); *H01J 37/045* (2013.01); *H01J 37/09* (2013.01); *H01J 37/145* (2013.01);
(Continued)

(58) Field of Classification Search
CPC ...................................................... B82Y 10/00
(Continued)

(56) References Cited

U.S. PATENT DOCUMENTS

| 4,937,458 A | * | 6/1990 | Fujikura | ................ | B82Y 10/00 |
| | | | | | 250/397 |
| 6,768,125 B2 | * | 7/2004 | Platzgummer | ......... | B82Y 10/00 |
| | | | | | 250/492.1 |

(Continued)

*Primary Examiner* — Phillip A Johnston
(74) *Attorney, Agent, or Firm* — Morris & Kamlay LLP

(57) ABSTRACT

The present invention relates to a charged particle system comprising: a charged particle source; a first multi aperture plate; a second multi aperture plate disposed downstream of the first multi aperture plate, the second multi aperture plate; a controller configured to selectively apply at least first and second voltage differences between the first and second multi aperture plates; wherein the charged particle source and the first and second multi aperture plates are arranged such that each of a plurality of charged particle beamlets traverses an aperture pair, said aperture pair comprising one aperture of the first multi aperture plate and one aperture of the second multi aperture plate, wherein plural aperture pairs are arranged such that a center of the aperture of the first multi aperture plate is, when seen in a direction of incidence of the charged particle beamlet traversing the aperture of the first multi aperture plate, displaced relative to a center of the aperture of the second multi aperture plate. The invention further pertains to a particle-optical component configured to change a divergence of a set of charged particle beamlets and a charged particle inspection method comprising inspection of an object using different numbers of charged particle beamlets.

6 Claims, 15 Drawing Sheets

Related U.S. Application Data division of application No. 11/991,547, filed as application No. PCT/EP2006/008694 on Sep. 6, 2006, now abandoned.

(60) Provisional application No. 60/714,556, filed on Sep. 6, 2005.

(51) Int. Cl.
  *H01J 37/317* (2006.01)
  *H01J 37/145* (2006.01)
  *H01J 37/147* (2006.01)
  *H01J 37/244* (2006.01)

(52) U.S. Cl.
  CPC ........ *H01J 37/147* (2013.01); *H01J 37/3177* (2013.01); *H01J 37/244* (2013.01); *H01J 2237/0435* (2013.01); *H01J 2237/0453* (2013.01); *H01J 2237/04922* (2013.01); *H01J 2237/04924* (2013.01); *H01J 2237/04926* (2013.01); *H01J 2237/15* (2013.01); *H01J 2237/2446* (2013.01); *H01J 2237/2448* (2013.01); *H01J 2237/2561* (2013.01); *H01J 2237/2817* (2013.01); *H01J 2237/31774* (2013.01)

(58) Field of Classification Search
  USPC .......................................................... 250/307
  See application file for complete search history.

(56) References Cited

U.S. PATENT DOCUMENTS

| | | | |
|---|---|---|---|
| 6,891,168 B2 | 5/2005 | Knippelmeyer et al. | |
| 6,897,458 B2 * | 5/2005 | Wieland ................ | B82Y 10/00 250/396 R |
| 7,109,484 B2 * | 9/2006 | Nakasuji .............. | G01N 23/225 250/307 |
| 7,129,502 B2 | 10/2006 | Kruit | |
| 7,135,676 B2 | 11/2006 | Nakasuji et al. | |
| 7,244,949 B2 * | 7/2007 | Knippelmeyer ....... | B82Y 10/00 250/310 |

* cited by examiner

CHARGED PARTICLE INSPECTION METHOD AND CHARGED PARTICLE SYSTEM

BACKGROUND OF THE INVENTION

Field of the Invention

The present invention relates to a charged particle system, a particle-optical component and a charged particle inspection method.

Brief Description of Related Art

With regard to the continuous development of ever smaller and more sophisticated microstructures such as semiconductor chips there is a need for further development and optimisation of both lithography and inspection systems for writing or inspecting, respectively, the required small dimensions of the microstructures. In addition, high throughput of production and examination of the microstructures is an important economic factor that places further demands on the performance required of lithography and inspection tools.

The decrease of critical dimensions of the microstructures has led to increased use of charged particle beam systems due to the ability of charged particle beams to provide higher resolution as compared to conventionally used wavelengths of light. To meet the requirement of high throughput in inspection and manufacture, there is also a growing trend towards a parallelization of processing using a multitude of charged particle beams rather than a single charged particle beam. This approach may involve use of a single source of charged particles with subsequent splitting of a beam generated by the source or parallel use of a multitude of sources, for instance.

Given the fast developments in this field, it is also desirable to provide tools that support and facilitate the development and construction of new charged particle systems.

In addition, there is a need for charged particle systems and components thereof which allow simple and fast handling of a multitude of charged particle beamlets.

Therefore, it is an object of the present invention to provide a charged particle system and a charged particle inspection method that allow examination of processes occurring during at least one of inspection and manufacture of microstructures using plural charged particle beamlets.

It is a further object of the present invention to provide a charged particle system and component of such a system that allows fast simultaneous deflection of a multitude of charged particle beamlets.

SUMMARY OF THE INVENTION

In response to the above objects, the present invention provides, in a first embodiment, a charged particle inspection method, comprising:

in a first mode of operation, directing a first number of primary charged particle beamlets onto an object surface, to generate a secondary charged particle beamlet from each of the primary charged particle beamlets incident on the object surface;

directing each of the secondary charged particle beamlets onto a detector arrangement to detect an intensity of each of the secondary charged particle beamlets, wherein a first number of intensities is detected;

in a second mode of operation, directing a second number of the primary charged particle beamlets onto the object surface, wherein the second number is at least one and less than the first number;

directing each of the secondary charged particle beamlets onto the detector arrangement to detect an intensity of each of the secondary charged particle beamlets, wherein a second number of intensities is detected.

Thus, in a first mode of operation, inspection involves a total first number of charged particle beamlets whereas inspection in a second mode of operation involves a total second number of charged particle beamlets which is smaller than the first number. For instance, the total second number may be 1 or a small fraction of the first number.

The inventors have found that this method enables examination of phenomena occurring on the object surface during charged particle inspection thereof which provides useful information in particular in the development of new applications of charged particle inspection methods and testing of charged particle systems.

In addition, using a single charged particle beamlet or just few charged particle beamlets for inspection is advantageous in that the single charged particle beamlets experiences less Coulomb interaction than a charged particle beamlet amidst a plurality of charged particle beamlets and is thus less blurred. As a result, the charged particle beamlet yields a better resolution.

The charged particle inspection method may involve the first number of primary charged particle beamlets being directed onto the object surface such that an array of beam spots is formed on the surface. The charged particle inspection method may, in addition, involve the second number of primary charged particle beamlets being directed onto the object surface such that an array of beam spots is formed on the surface.

The charged particle inspection method may further comprise generating image data of the surface by scanning the array of beam spots across the surface and recording associated intensities of the secondary charged particle beamlets.

The method may further comprise obtaining surface charging information by comparing detected intensities of the secondary charged particle beamlets when the first number of primary charged particle beamlets is directed onto the surface in the first mode of operation with detected intensities of the secondary charged particle beamlets or with a detected intensity of the secondary charged particle beamlet, respectively, when the second number of primary charged particle beamlets is directed onto the surface in the second mode of operation.

For applications such as examination of surface charge phenomena that occur on the object surface during multi beam inspection thereof, fast switching between the first and second modes of operation, i.e. the steps of directing the first and second numbers of charged particles on the object surface and detecting secondary charged particles generated thereby is desirable.

The steps of directing the first and second numbers of charged particles on the object surface and detecting secondary charged particles generated thereby may be repeated as many times as required. It may, for instance, be suitably alternated between the two modes of operation. It is also conceivable to have at least a third mode of operation that differs from the first and second modes of operation by virtue of at least one of a number of charged particle beamlets directed at the object surface, a choice of particular charged particle beamlets employed or a resolution or focussing power of the charged particle beamlet(s) employed.

The directing of the different numbers of charged particle beamlets onto the object surface is accomplished by the same charged particle system. It may involve the same charged particle optical column or a portion of a plurality of columns configured to generate the first number of charged particle beamlets in the first mode of operation being switched to a second mode of operation, wherein only the smaller, second number of primary charged particle beamlets is generated. Alternatively, it may involve the system being switched to a second mode of operation wherein a portion of the first number of charged particles is intercepted from reaching the object surface such that only the second number of primary charged particle beamlets reaches the object surface. Intercepting the first number of primary charged particle beamlets may involve application of an electrical field in a region of the beam paths of the first number of primary charged particle beamlets such that a third number out of the first number of primary charged particle beamlets is caused to be incident on a beam stop such that only the second number of charged particle beamlets reaches the object surface, the third number, which is intercepted by the beamstop, being equal to a difference between the first and second numbers. In other exemplary embodiments, intercepting the first number of primary charged particle beamlets may involve mechanical movement of a beamstop into paths of the first number of primary charged particle beamlets such that a third number out of the first number of primary charged particle beamlets is caused to be incident on the beam stop such that only the second number of charged particle beamlets reaches the object surface, the third number, which is intercepted by the beamstop, being equal to a difference between the first and second numbers. The beamstop may be an aperture plate, for instance, that may be slided or rotated into position. In dependence of the second and third numbers, the aperture plate may comprise a number of apertures that is equivalent to the second number and thus allows the second number of charged particles to pass through the apertures, whereas the third number of charged particle beamlets is incident on the aperture plate. In further exemplary embodiments, the aperture plate may comprise various sections wherein each section comprises a different number of apertures so as to allow generation of different second numbers of charged particle beamlets in dependence of the section arranged in the beam paths of the first number of charged particle beamlets. In other exemplary embodiments, the sections may differ by virtue of a pattern of apertures so as to allow generation of different patterns of the second number of charged particle beamlets. Exemplary embodiments of a third or fourth aperture plate for changing a number of charged particle beamlets incident on the object are disclosed in U.S. provisional application No. 60/714,556 to the same Assignee, filed on Sep. 6, 2005, the priority of which is claimed by the present invention, and the entire contents of which is incorporated by reference herein.

Thus, in an exemplary embodiment, directing the second number of primary charged particles onto the object surface comprises directing the first number of primary charged particle beamlets through an electrical or magnetic field, the electrical or magnetic field being configured such that a third number of charged particle beamlets is incident on a beam stop disposed downstream of the electrical or magnetic field such that only the second number of charged particle beamlets—being equal to a difference between the first and third numbers—is incident on the object surface.

Exemplary embodiments of charged particle systems and particle-optical components suitable for carrying out the above described method will be described in the following.

In a second embodiment, the present invention provides a charged particle system, comprising:

a source of primary charged particle beamlets;

a field generating arrangement configured to generate at least one of a magnetic and electrical field extending over a space traversed by beam paths of the primary charged particle beamlets, a beamstop disposed downstream of the field generating arrangement;

a controller configured to selectively switch the field generating arrangement from a first mode of operation to a second mode of operation, wherein a first field associated with the first mode of operation is different from a second field associated with the second mode of operation;

wherein the field generating arrangement and the beamstop are arranged such that a first number of primary charged particle beamlets bypasses the beamstop when the field generating arrangement is switched to the first mode of operation and such that a second number of primary charged particle beamlets bypasses the beamstop when the field generating arrangement is switched to the second mode of operation, wherein the second number is at least one and less than the first number, and wherein a third number of primary charged particle beamlets is incident on the beamstop when the field generating arrangement is switched to the second mode of operation, wherein the third number is equal to a difference between the first and second numbers.

In other words, the field generating arrangement is arranged and configured to generate the magnetic or electrical field such that the area covered by the field encompasses an area containing the beam paths of the primary charged particle beamlets that are to reach the object surface. By way of example, the field generating arrangement may be configured such that substantially all beam paths of primary charged particle beamlets of the system pass through the field generated by the field generating arrangement.

Thus, the charged particle system makes use of two modes of operation that differ by virtue of the electrical or magnetic field that plural primary charged particle beamlets pass through simultaneously, for instance the first number of charged particle beamlets.

There is a growing trend towards use of maskless lithography systems, some of which are based on one or more multi aperture plates for the generation of a pattern to be transferred on the object to be exposed. This type of multi aperture plate is often referred to as a blanking aperture array (BAA). An example of such an array may be found in US 2003/0155534 A1, for instance. Those multi aperture plates generally comprise deflectors disposed on each aperture, which are configured such that charged particle beamlets passing through the aperture may be individually controlled and deflected, independently of charged particle beamlets traversing the other apertures. This is accomplished by programming a sequence in which the deflectors of individual apertures are switched on and off. Switching selected apertures on and off allows programming of certain patterns of charged particles and directing them onto the object surface. Sequential exposure to these patterns that overlap on the object surface allows writing of a predetermined microstructure onto the object surface.

In contrast to a blanking aperture array as used in a lithography system, the field generating arrangement, which may be a magnetic field generating arrangement or a pair of electrodes and may comprise multi apertures plates, is configured and arranged to provide an electrical or magnetic field extending over a region that all charged particle beamlets to be directed onto the object surface, i.e. a total number equivalent to the first number of charged particle beamlets, pass through. Thus, selectively switching to a particular mode of operation will affect all charged particle beamlets travelling through the electrical or magnetic field present, rather than just individual ones. It is, however, conceivable to combine one of the multi aperture plates with a blanking aperture array and make use both of individual as well as overall deflection. It is also conceivable to use additional deflecting elements within a space of the field generating arrangement, such as in between two multi aperture plates that may form the field generating arrangement.

The field generating arrangement may be disposed outside of a perimeter of an area traversed by the beam paths of the charged particle beamlets. Alternatively, it may be disposed traverse to and thus within a total area in which beam paths of the charged particle beamlets are located. In the latter case, the field generating arrangement comprises apertures that allow the charged particle beamlets to pass through.

In exemplary embodiments, the two modes of operation may differ in that only one mode of operation comprises application of an electrical or magnetic field, or the two modes of operation may differ in terms of a field strength or field configuration such that they cause a different extent of deflection of charged particle beamlets resulting in a different number of charged particle beamlets being deflected by the electrical or magnetic field and thus being either blocked by or allowed to pass by the beam stop. The term field configuration relates to a distribution and orientation of equipotential lines, amongst others.

The mode in which the first number of primary charged particle beamlets is directed at the substrate is referred to as the first mode of operation in the context of the present application, and the mode of operation wherein the second number of charged particle beamlets is directed at the substrate is consequently referred to as the second mode of operation.

In exemplary embodiments, the field generating arrangement may comprise a pair of electrodes, an electrical multipole lens, a magnetic lens, a combination of an electrical and a magnetic lens or any other suitable arrangement allowing the generation of an electrical and/or magnetic field covering the area that the charged particle beamlets pass through.

In exemplary embodiments, the field generating arrangement comprises a first pair of electrodes for generating an electrical field between the first pair of electrodes, wherein beam paths of the primary charged particle beamlets traverse a space between the first pair of electrodes; and wherein the controller is configured to selectively apply a first voltage difference to the first pair of electrodes to generate a first electrical field in the first mode of operation and a second voltage difference to the first pair of electrodes to generate a second electrical field in the second mode of operation. The first voltage difference is different from the second voltage difference.

The first and second numbers can generally be chosen to suit the needs of a particular application. The second number could be as small as one, for instance, or could be in a range of one to one hundred, by way of example. The first number may be any number between 2 and 1,500,000. In exemplary embodiments, a difference between the first and second numbers is in a range of from 1 to 1,000,000.

In further exemplary embodiments, the controller may be further configured to selectively apply a third voltage to the first pair of electrodes, the application of the third voltage being configured such that it results in a number of primary charged particle beamlets bypassing the beam stop which is different from the first and second numbers. Application of further voltages and thus modes of operation would also be feasible.

The charged particle system may further be configured such that downstream of the beam stop, a beam path of at least one of the primary charged particle beamlets bypassing the beam stop in the first mode of operation coincides with at least one of the primary charged particle beamlets bypassing the beam stop in the second mode of operation. Switching of electrical or magnetic fields leads to a shift of beam paths of primary charged particle beamlets.

In an exemplary embodiment, the first pair of electrodes may include two plates which are laterally disposed relative to the beam paths of the primary charged particle beamlets. Thus, the electrodes may be disposed on either side of an area encompassing the beam paths of the first number of primary charged particle beamlets in a plane substantially orthogonal to an average direction of the beam paths, and thus be arranged opposite to one another. In an exemplary embodiment, the electrical field is a substantially homogeneous electrical field configured to cause a deflection of the primary charged particle beamlets in a same direction relative to the object surface.

The charged particle system may further comprise a second pair of electrodes including two plates which are laterally disposed relative to the beam paths of the primary charged particle beamlets downstream of the first pair of electrodes. Those two plates would thus be axially offset from the first pair of electrodes. This would allow generation of two different electrical fields in series, for instance.

The charged particle system may further comprise at least a third pair of electrodes including two plates which are laterally disposed relative to the beam paths of the primary charged particle beamlets downstream of the beam stop.

Also, the second and third pairs of electrodes may be arranged such as to generate an electrical field causing a deflection of charged particles in one direction relative to the object surface. The controller may then be further configured to selectively apply third and fourth, respectively fifth and sixth voltage differences to the second, respectively third pair of electrodes.

The same configuration of deflecting field(s) as described above in connection with the sets of electrodes can be achieved using suitable magnetic configurations, such as magnetic coils and the like.

In an alternative exemplary embodiment, the first pair of electrodes may comprise two multi aperture plates which have a plurality of apertures formed therein and which are oriented substantially transverse to the beam paths of the primary charged particle beamlets, each beam path traversing at least one electrode of the pair of electrodes through one of the apertures formed therein. In an exemplary embodiment, a second multi aperture plate disposed downstream of a first multi aperture plate is configured such that each beam path traversing an aperture of the first multi aperture plate also traverses an aperture of the second multi aperture plate. Thus, each aperture of the first multi aperture plate being traversed by a beam path would have a corresponding aperture in the second multi aperture plate, thus forming an aperture pair.

The embodiment using multi aperture plates may be used to generate either electrical or magnetic fields or both. In exemplary embodiments, the first multi aperture plate is coupled to a first pole piece and the second multi aperture plate may be coupled to a second pole piece. Such an arrangement is shown in FIG. 13a of U.S. provisional application 60/714,556 as cited above. First and second voltages would then be applied as corresponding excitation currents to an excitation coil within the first and second pole pieces and serve to generate different magnetic fields in between the first and second multi aperture plates in the first and second modes of operation. The same considerations with respect to interchangeability of electrical and magnetic fields are equally applicable to all of the described exemplary embodiments relating to generation of electrical fields.

The first and second multi aperture plates are arranged to form a gap between them. In an exemplary embodiment, the first and second multi aperture plates are substantially flat and are arranged in parallel to one another. Application of a voltage to the first and second multi aperture plates thus results in the generation of an electrical field in the gap between them. In an exemplary embodiment, a surface of the second multi aperture plate is disposed at a distance in a range of from about 10 µm to about 1 mm downstream of a surface of the first aperture plate, by way of example between about 100 µm to about 500 µm.

In this exemplary embodiment, plural aperture pairs are arranged such that a center of the one aperture of the first multi aperture plate is, when seen in a direction of incidence of the charged particle beamlet traversing the one aperture of the first multi aperture plate, displaced relative to a center of the one aperture of the second multi aperture plate by a distance which is less than a diameter of the one aperture of the first electrode.

For instance, the distance may be greater than 0.05 times, by way of example 0.01 or 0.05 or 0.1 times the diameter of the respective aperture of the first multi aperture plate (electrode).

At least one aperture pair, other than an aperture pair comprised in the plural aperture pairs with a displacement of aperture centers as described above, may be arranged such that a center of the other apertures of the plurality of apertures of the first electrode is aligned with a center of a corresponding one of the other apertures of the first electrode such that the centers substantially coincide when seen in a direction in which charged particles are incident in an area of a particular aperture of the first multi aperture plate. Thus, the apertures in the first and second multi aperture plates would generally be coaxial. Thus, at least two different groups of aperture pairs are formed in the system according to the second embodiment: one group comprising the plural aperture pairs wherein apertures are displaced relative to one another and another group comprising at least one aperture pair wherein apertures are either aligned with one another or substantially differently displaced with respect to one another.

In an exemplary embodiment, when seen in a direction of incidence of primary charged particles traversing an aperture pair, a center of each of a fourth number of apertures of a second electrode of the first pair of electrodes is displaced relative to a center of a corresponding one of the apertures of the first electrode by a distance which is less than a diameter of the one aperture of the first electrode, wherein the fourth number is equal to the third number of charged particle beamlets incident on the beamstop in the second mode of operation as described above in connection with the method according to the present invention. Thus, the charged particle beamlets passing through those apertures are incident on the beam stop upon application of the second voltage. A number of aperture pairs, which number is equivalent to the second number of charged particle beamlets, are arranged such that a center of the aperture of the second electrode (multi aperture plate) is aligned with a center of the corresponding aperture of the first electrode (multi aperture plate), such that the second number of charged particle beamlets passes through the beamstop and is incident on the object surface in the second mode of operation.

Application of an electrical field that can be switched on and off or altered by a change of the voltage difference applied to the pairs of electrodes/multi aperture plates allows practically instant switching between the two modes of operation. In addition, the electrical field exerts an influence on all of the first number of charged particle beamlets rather than just individual ones which allows a fairly simple instrumental set up and control program for the controller;

Other configurations and arrangements of the multi aperture plates are conceivable and will be described in more detail below in connection with the third embodiment. They are equally applicable to the second embodiment under the provision that switching from a first to a second mode of operation results in a different number of charged particles reaching the object surface. This may be achieved by providing at least two different groups of aperture pairs differing by virtue of an alignment/displacement. In contrast to the second embodiment, the third embodiment also provides for blanking of all charged particle beamlets.

In a third embodiment, the present invention provides a charged particle system, comprising:

at least one charged particle source;

a first multi aperture plate disposed downstream of the at least one charged particle source, the first multi aperture plate comprising a plurality of apertures;

a second multi aperture plate disposed downstream of the first multi aperture plate, the second multi aperture plate comprising a plurality of apertures;

a controller configured to selectively apply at least first and second voltage differences between the first and second multi aperture plates;

wherein the at least one charged particle source and the first and second multi aperture plates are arranged such that each of a plurality of charged particle beamlets traverses an aperture pair, said aperture pair comprising one aperture of the first multi aperture plate and one aperture of the second multi aperture plate, wherein plural aperture pairs are arranged such that a center of the one aperture of the first multi aperture plate is, when seen in a direction of incidence of the charged particle beamlet traversing the one aperture of the first multi aperture plate, displaced relative to a center of the one aperture of the second multi aperture plate.

Application of first and second voltage differences shall also apply to exemplary embodiments wherein the first multi aperture plate is coupled to a first pole piece and the second multi aperture plate is coupled to a second pole piece of a magnetic circuit. Such an arrangement is shown in FIG. 13a of U.S. provisional application 60/714,556 as cited above. First and second voltages would then be applied as corresponding excitation currents to an excitation coil arranged within the first and second pole pieces and serve to generate first and second magnetic fields in between the first and second multi aperture plates in the first and second modes of operation.

In an exemplary embodiment, the plural aperture pairs are arranged such that the center of the aperture of the first multi aperture plate of a respective aperture pair is, when seen in the direction of incidence of the charged particle beamlet traversing the aperture of the first multi aperture plate, displaced by a distance relative to the center of the aperture of the second multi aperture plate, which distance is less than a diameter of the respective aperture of the first multi aperture plate. The distance may be greater than about 0.01 times the diameter of the aperture of the first multi aperture plate, for instance.

The plural aperture pairs may comprise all aperture pairs formed by the apertures of the first and second multi aperture plates. In alternative embodiments, the plural aperture pairs may comprise a portion of all aperture pairs formed by the apertures of the first and second multi aperture plates.

The distance may be the same distance in all of the plural aperture pairs or may be different in the plural aperture pairs. In exemplary embodiments, the plural aperture pairs comprise a first group of aperture pairs which are arranged such that the center of the aperture of the first multi aperture plate is, when seen in the direction of incidence of the charged particle beamlet traversing the aperture of the first multi aperture plate, displaced by a first distance relative to the center of the aperture of the second multi aperture plate, and wherein the plural aperture pairs comprise a second group of aperture pairs which are arranged such that that the center of the aperture of the first multi aperture plate is, when seen in the direction of incidence of the charged particle beamlet traversing the aperture of the first multi aperture plate, displaced by a second distance relative to the center of the aperture of the second multi aperture plate, wherein the second distance is at least 1.05 times the first distance.

In further exemplary embodiments, the plural aperture pairs further comprise a third group of aperture pairs which are arranged such that the center of the aperture of the first multi aperture plate is, when seen in the direction of incidence of the charged particle beamlet traversing the aperture of the first multi aperture plate, displaced by a third distance relative to the center of the aperture of the second multi aperture plate, wherein the third distance is greater than the first and second distances, and at least 1.10 times the first distance.

The first and second groups of aperture pairs may be arranged in any suitable pattern, for instance the first group may be surrounded by the second group or vice versa, the first group may be arranged on one half of the multi aperture plate whereas the second group is arranged on the other half, to name but a few possibilities.

In further exemplary embodiments, the plural aperture pairs may comprise further groups of aperture pairs having increasingly greater distances between respective centers of apertures of alignment pairs.

The apertures in the first multi aperture plate comprised in the plural aperture pairs may be arranged in a first pattern and the apertures in the second multi aperture plate comprised in the plural aperture pairs may be arranged in a second pattern which is different from the first pattern. For instance, a distance between two adjacent apertures in the first multi aperture plate may be different from a distance between associated apertures in the second multi aperture plate. In one exemplary embodiment, the apertures in the first multi aperture plate may be arranged symmetrically and equidistantly thus forming a pattern comprising equidistant columns and rows. The second multi aperture plate in that exemplary embodiment may comprise a pattern wherein apertures have an increasing distance from one another with increasing distance from a center of the second multi aperture plate. Thus, arranging the first and second multi aperture plates results in a displacement between associated centers of apertures in the first and second multi aperture plates being increasingly displaced with increasing distance from the centers of the multi aperture plates.

Suitable choice of a displacement of the associated centers of an aperture pair in combination with a choice of a suitable voltage difference applied allows control of a degree to which a charged particle beamlet passing through the respective alignment pair is deflected. Typically, the arrangement of the multi aperture plates is such that the more the centers of the apertures of an alignment pair are displaced relative to one another, the greater a degree of deflection becomes.

In exemplary embodiments, the plural aperture pairs may be arranged such that displacement between the respective centers of the apertures of a respective aperture pair is in a same direction for all of the plural aperture pairs.

In other exemplary embodiments, the plural aperture pairs may be arranged such that displacement is in different directions for different aperture pairs of the plural aperture pairs. In an exemplary embodiment, the first and second multi aperture plates comprise a center and displacement of the respective center of an aperture relative to the center of the associated aperture of the aperture pair is in a direction opposite the center of the multi aperture plate. In an exemplary embodiment, displacement may be such that a center of the one aperture of the second multi aperture plate is disposed radially outwards with respect to the center relative to the one aperture of the first multi aperture plate, or vice versa.

In other exemplary embodiments, the plural aperture pairs may be divided into groups of aperture pairs which are grouped according to the criterion that the one aperture of the first multi aperture plate is, when seen in a direction of incidence of the charged particle beamlet traversing the one aperture of the first multi aperture plate, displaced by a same distance relative to a center of the one aperture of the second multi aperture plate and/or displaced in a same direction relative to a the center of the first multi aperture plate.

Displacement may be symmetric with respect to the center of the first multi-aperture plate, or a center of a pattern formed by the apertures or any other suitable point of symmetry, or it may be asymmetric.

Exemplary embodiments, in which a distance between the respective centers of the apertures in a respective alignment pair increases with increasing distance from a center of the first multi aperture plate allows generation of a set of charged particle beamlets, which is, upon exit from an electrical field between the first and second multi aperture plates, divergent, i.e. a distance between at least some adjacent charged particle beamlets increases with increasing distance from a center of the set of charged particle beamlets. A divergence involving an increasing distance between adjacent charged particle beamlets allows to achieve a defocusing effect for the set of charged particle beamlets.

Likewise, a focusing effect can be achieved by arranging the centers of respective apertures of the plural aperture pairs such that they have a decreasing distance from one another with increasing distance from a center of the first multi aperture plate.

For instance, in a pattern of apertures comprising a square array of apertures in the first and second multi aperture plates with apertures disposed in rows and columns, the plural apertures may comprise a first group of aperture pairs wherein the centers of the apertures are displaced from one another by a first distance $S1$, a second group of apertures wherein the centers of the apertures are displaced from one another by a second distance $S2=S1*1.05$ and a third group of apertures wherein the centers of the apertures are displaced from one another by a third distance $S3=S1*1.10$, wherein a direction of displacement is in a direction away from a center of the array.

The charged particle system according to the third embodiment may be used as a general deflecting arrangement that allows fast, simultaneous and very uniform deflection of a multitude of charged particle beamlets. This deflection allows a fast change of a position of the charged particle beamlets on the object surface that may be used in scanning and other applications.

In exemplary embodiments, the charged particle system according to the third embodiment may further comprise a beamstop, wherein the first and second multi aperture plates and the beam stop are arranged such that a first number of primary charged particle beamlets bypasses the beam stop when the first voltage difference is applied and further such that a second number of primary charged particle beamlets bypasses the beam stop when the second voltage difference is applied. In those embodiments, the total number of charged particle beamlets reaching the object surface is the first number in the first mode of operation and the second number in the second mode of operation.

In one example, the second number may be at least one and less than the first number. This exemplary embodiment may involve a third number of primary charged particle beamlets being incident on the beam stop when the second voltage difference is applied, wherein the third number is equal to a difference between the first and second numbers. Thus, the total number of charged particle beamlets reaching the object surface is at least one in both modes of operation. Thus, the system is used to block a portion of charged particle beamlets resulting in different numbers of charged particle beamlets reaching the object surface. This embodiment is particularly useful in connection with the method described above.

In an alternative exemplary embodiment, the second number may be zero. This can be used to the effect that deflection of the charged particle beamlets leads to all of them impinging on the beamstop and no charged particle beamlets reach the object surface. Thus, this exemplary embodiment can be used as a general blanker that simultaneously deflects all charged particle beamlets. Thus, this exemplary embodiment is useful in applications where fast and uniform deflection of a multitude of charged particle beamlets is desirable. The arrangement comprising the two multi aperture plates and the voltage supply thus forms a particle optical component that is particularly useful to simultaneously block all charged particle beamlets from reaching the object surface and functions as a general blanker.

In exemplary embodiments, the plural aperture pairs may comprise different subsets of aperture pairs. For instance, the aperture pairs of a first subset may be configured such that the aperture of the second multi aperture plate is offset relative to the aperture of the first multi aperture plate in a first direction and the aperture pairs of the second subset may be configured such that the aperture of the second multi aperture plate is offset relative to the aperture of the first multi aperture plate in a second direction, the first and second directions being different directions relative to a center of the first multi aperture plate. Thus, application of a voltage difference between the first and second multi aperture plates would lead to a deflection of charged particle beamlets passing through the aperture pairs of the two subsets being deflected in different directions, thus generating different sub-arrays of charged particle beamlets. Other suitable configurations, arrangements and divisions into groups have been described before.

In an exemplary embodiment, a pattern of apertures of the first multi aperture plate is substantially the same as a pattern of apertures of the second multi aperture plate, and the first and second multi aperture plates are arranged relative to each other such that the patterns are not in registry, but slightly shifted relative to one another such that aperture pairs with the aperture in the first aperture plate being offset from the associated aperture in the second multi aperture plate are formed.

In further exemplary embodiments, in particular the charged particle system according to the present invention that comprise first and second multi aperture plates may further comprise a third multi aperture plate disposed upstream of the first multi aperture plate.

The third multi aperture plate may comprise a plurality of apertures and be arranged such that the aperture pairs each further have an associated aperture of the third multi aperture plate, wherein the associated aperture of the third multi aperture plate is arranged such that a center thereof is, when seen in a direction of incidence of the charged particle beamlet traversing the aperture of the first multi aperture plate, substantially aligned with the center of the aperture of the first multi aperture plate of the aperture pair.

In those exemplary embodiments, the controller may be further configured to selectively apply at least third and fourth voltage differences between the first and third multi aperture plates. By way of example, in the first mode of operation, a third voltage difference other than zero may be applied between the first and third multi aperture plates while no voltage difference, i.e. a first voltage difference of zero, is applied between the first and second multi aperture plates. This results in generation of an electrical field in between the first and third multi aperture plates, but no electrical field in between the first and second multi aperture plates. Thus, in the first mode of operation, charged particle beamlets are focused by the electrical field between the first and third multi aperture plates and the first number of charged particle beamlets reaches the object surface. In the second mode of operation, a fourth voltage difference of zero may be applied between the first and third multi aperture plates, whilst a second voltage difference other than zero is applied between the first and second multi aperture plates to generate an electrical field between them. Due to the aperture of the first multi aperture plate being offset from the associated aperture of the second multi aperture plate in plural aperture pairs, when seen in a direction in which charged particle beamlets pass through the aperture pair, the electrical field generated between the first and second multi aperture plates is configured such that those charged particle beamlets having passed through one of the plural aperture pairs are deflected relative to the direction of incidence. This embodiment is particularly advantageous in that focusing and deflection of the charged particle beamlets can be achieved by the same, fairly simple component. In addition, deflection of the charged particle beamlets is very uniform. Moreover, this embodiment only requires one controller for deflection and focusing purposes.

In alternative embodiments, the third multi aperture plate may comprise less apertures than there are aperture pairs in the first and second multi aperture plates, in which case a charged particle beamlet having passed through an aperture of the third multi aperture plate is divided into several charged particle beamlets upon traversal of aperture pairs.

In further exemplary embodiments, the first and second multi aperture plates further comprise aperture pairs in which the aperture in the first multi aperture plate is in registry with the associated aperture in the second multi aperture plate when seen in the direction of incidence of the charged particle beamlet traversing the aperture pair. Thus the apertures are aligned relative to one another substantially such that any deviation from a perfect alignment is generally due to the limits set by an achievable precision of alignment.

In further exemplary embodiments, the distance of displacement of the aperture centers relative to one another may be suitably chosen such that groups of aperture pairs cause different degrees of deflection of the charged particle beamlets.

Suitable arrangement of the beam stop allows blocking primary charged particle beamlets in dependence of the deflection they experience.

The first and second multi aperture plates may have substantially plane surfaces to form a gap having a substantially constant width between them. The substantially constant width refers to a width having only variations which lie within a reasonable alignment precision that may be achieved upon arranging the first and second multi aperture plates relative to each other.

In a further exemplary embodiment, the first and second multi aperture plates have curved surfaces. Curvatures of the first and second multi aperture plates may, for instance, be chosen such that they form a gap between them, with the gap preferably having a substantially constant width, at least in a region of the plurality of apertures of the multi aperture plates. In those embodiments, defining a displacement of a center of an aperture in the second multi aperture plate relative to a center of a corresponding aperture in the first multi aperture plate is based on viewing the respective aperture in a direction substantially orthogonal to a surface region of the first multi aperture plate adjacent to and surrounding the respective aperture. For instance, the multi apertures may each have a biconvex or biconcave shape.

In alternative exemplary embodiments, the multi aperture plates may be tilted relative to one another such that a gap of varying width is generated.

As used herein, the center of an aperture shall refer to the center of the aperture as determined on a side of the aperture plate facing an upstream direction of the overall charged particle system.

In exemplary embodiments of the systems and components according to the present invention, an absolute value of the first voltage difference may be less than an absolute value of the second voltage difference.

A voltage difference shall be defined as a difference between a predetermined voltage and ground potential.

Thus, an absolute value of the first voltage difference, i.e. a difference between a first voltage and ground potential may be set to be less than an absolute value of the second voltage difference, i.e. a difference between a second voltage and ground potential. In other words, the first voltage may be a more positive or more negative voltage than the second voltage.

In alternative exemplary embodiments, an absolute value of the second voltage difference may be less than an absolute value of the first voltage difference, which means that an absolute value of a difference between a second voltage and ground potential may be set to be less than an absolute value of a difference between a first voltage and ground potential.

One of the first and second voltages (and thug voltage differences) may be zero, for instance. Hence, there would be no electrical field present in one of the modes of operation, as mentioned before.

The charged particles may be any charged particles known in the art, such as electrons, ions and muons.

In a fourth embodiment, the present invention provides a particle-optical component for manipulating a plurality of beamlets of charged particles, the particle-optical component comprising:

a first multi aperture plate comprising a plurality of apertures and a second multi aperture plate comprising a plurality of apertures, the first and second multi aperture plates forming a gap between them, a controller configured to selectively apply at least a first voltage difference between the first and second multi aperture plates to generate at least a first electrical field between them, wherein the first and second multi aperture plates are configured and positioned relative to each other such that the first electrical field generated changes a divergence of a set of charged particle beamlets traversing the particle-optical component upon exit from the particle-optical component.

Divergence, as used herein, shall comprise a positive or a negative divergence, and thus also comprises what is generally referred to as a convergence. The divergence may also be zero.

In exemplary embodiments, the divergence is changed such that an angle between two charged particle beamlets, for instance two adjacent charged particle beamlets or two opposite peripheral charged particle beamlets, exiting the particle-optical component is increased or decreased by at least about 0.01 mrad, for instance at least about 0.05 mrad, at least about 0.1 mrad or at least about 0.15 mrad.

In further exemplary embodiments, the divergence is changed such that an angle formed between a peripheral charged particle beamlet having exited the charged particle component and the second multi aperture plate is increased or decreased by at least about 0.01 mrad, for instance at least about 0.1 or at least about 0.1 mrad, in further examples at least about 10 mrad and in still further examples at least about 50 mrad.

Suitable configurations of the first and second multi aperture plates, voltage differences applied and electrical fields have been described above and equally apply to this embodiment of the present invention. The particle-optical component may further comprise at least one of a third multi aperture plate and a beam stop as described above.

The beam stop used in embodiments of the systems and component according to the present invention may be any arrangement suitable for intercepting a charged particle beamlet or a predetermined number of charged particle beamlets from reaching the object surface.

In an exemplary embodiment, the beam stop may include a multi aperture plate having a plurality of apertures formed therein. The number of apertures in the aperture plate of the beam stop may be adjusted to the number of apertures in at least one of the first and second multi aperture plates. For instance, the aperture plate of the beam stop may comprise a first number of apertures, each of which apertures is arranged to be traversed by one of the first number of primary charged particle beamlets. In an alternative exemplary embodiment, the number of apertures of the multi aperture plates could be chosen such that at least a portion of the apertures of the beam stop is traversed by more than one primary charged particle beamlet. In the context of the present invention, the terms beam stop and blanking plate are used synonymously.

The apertures in the (multi) aperture plates may be round or elliptical, or they may be square or rectangular, for instance. The plurality of apertures typically forms a pattern of apertures, which aperture pattern may be regular or irregular. The pattern may be, for instance, a highly regular rectangular grid of apertures with a number of apertures disposed in rows and columns wherein apertures disposed adjacent to one another in a row or column may be spaced a same distance apart, and wherein the apertures generally have the same diameter. Various examples of other suitable patterns are disclosed in WO 2005/024881, the entire contents of which is incorporated by reference herein.

Apertures, as used herein, are perforations or through holes, i.e. they extend through the entire thickness of the plate (at the location of the aperture) and thus have openings on both a front side and a back side of the plate they are comprised in. Plate, as used herein, shall also encompass a thin foil or a plate having one or more sections that form a thin foil.

The process of arranging the first and second multi-aperture plates, or more generally any two multi aperture plates, relative to each other may be optically controlled by generating a Moire pattern or an interferogram from light reflected from or transmitted by components associated with the multi-aperture plates. Background information and examples of high-precision alignment are given in the articles "Self-Aligned Assembly of Microlens Arrays with Micromirrors" by A. Tuantranont et al., Part of the SPIE Conference on Miniaturized Systems with Micro-Optics and MEMS, Santa Clara, September 1999, SPIE Vol. 3878, pages 90 to 100 and "Microassembly Technologies for MEMS" by M. B. Cohn et al., Part of the SPIE Conference on Micromachining and Microfabrication Process Technology IV, Santa Clara, Calif., September 1998, SPIE Vol. 3511, pages 2 to 16, which are incorporated herein by reference.

The charged particle system may further comprise an objective lens for focusing the primary charged particle beamlets onto the surface of the object. In exemplary embodiments, the objective lens is disposed downstream of the beam stop.

In further exemplary embodiments, the charged particle system further comprises a detector arrangement for detecting an intensity of secondary charged particles generated by the primary charged particle beamlets having bypassed the beam stop and being incident on the object surface.

The object may be a semiconductor wafer, for instance, which is sensitive to exposure to charged particles or may have a coating that is sensitive to charged particles or may be any other object intended to be examined by charged particle inspection. The terms object and substrate are used synonymously herein.

Generally, each primary charged particle beamlet incident on the object surface generates a secondary charged particle beamlet, either by emission from the object or backscattering, and the detector arrangement may be further configured to detect an intensity of each of the secondary charged particle beamlets. The system may further comprise a beam splitter for separating the beam paths of the primary charged particle beamlets from beam paths of the secondary charged particle beamlets and for directing the secondary charged particle beamlets onto the detector arrangement.

The detector arrangement may be any suitable detector arrangement known in the art, in particular in the field of electron microscopy. The detector arrangement may be a position-sensitive detector having a plurality of detecting pixels. The pixels may be arranged in an array that matches an array formed by secondary charged particle beamlet spots generated by the secondary charged particle beamlets such that each pixel can detect an intensity of an associated secondary charged particle beamlet. The detector arrangement may be a solid state CCD or CMOS, a scintillator arrangement, a micro channel plate, an array of PIN diodes, for instance.

In exemplary embodiments, the detector arrangement is disposed in a space between the beam stop and the object. The detector arrangement may be disposed adjacent to the beam stop.

The charged particle source may be any suitable charged particle source configured to generate a beam of charged particles. The charged particle source may also comprise an array of several individual charged particle sources thus forming a source of primary charged particle beamlets.

The source of charged particle beamlets may be a charged particle source configured to generate one beam of charged particles and further comprise an arrangement for splitting the beam of charged particles into a plurality of charged particle beamlets. An example of such an arrangement is a multi aperture plate comprising plural apertures, with charged particle beamlets being formed by those charged particles that pass through the apertures. The multi aperture plate forming the first electrode in the charged particle system according to an exemplary embodiment of the present invention may serve as the arrangement configured to split the charged particle beam into plural charged particle beamlets, i.e. form part of the source of primary charged particle beamlets. In other embodiments, the source of charged particle beamlets comprises a multi aperture plate disposed upstream of the first and second electrodes. It may be comprised of the third multi aperture plate provided in other exemplary embodiments.

In other exemplary embodiments, the source of charged particle beamlets may comprise an array of charged particle sources generating one or more charged particle beamlets each. Other suitable charged particle components may be used, as will be apparent to the person skilled in the art.

The systems according to the present invention may further comprise a main controller configured to change a setting of at least one of the charged particle source, the objective lens, the beamstop, the detector arrangement, a deflector or other components of the systems, change a position of an object holder and change a working distance in dependence of a mode of operation the system is set to. Thus, the properties of the system may be adapted to a particular mode of operation. In a lithography system, for instance, the system may be switched to an inspection mode using only one charged particle beamlet for inspection, wherein other optical properties, such as a focusing power, for instance, of the system are adapted to the inspection mode.

The systems according to the present invention may be inspection systems, such as electron microscopes, lithography systems, and lithography systems comprising an inspection mode, to name a few examples. The particle-optical component according to the present invention may be used in any of these systems.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
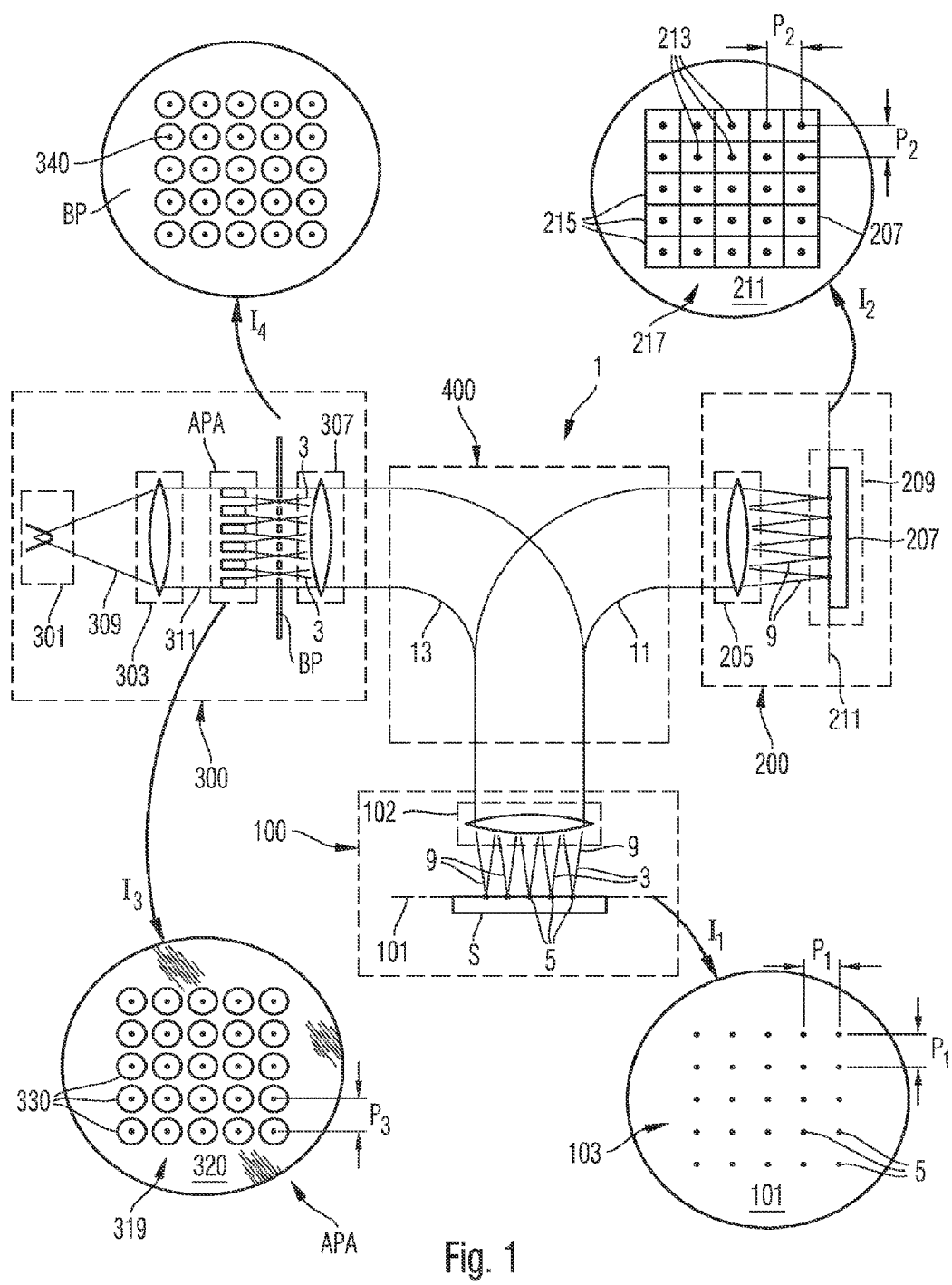
FIG. 1 shows a schematic cross-section of an exemplary embodiment of a charged particle system according to the present invention configured as a multi beam electron microscope (side view)

FIG. 1 is a schematic diagram illustrating basic functions and features of a charged particle system configured as an electron microscopy system 1. The electron microscopy system 1 is of a scanning electron microscope type (SEM) using a plurality of primary electron beamlets 3 for generating primary electron beam spots 5 on a surface of a substrate S to be inspected. The surface of the substrate S is arranged in a substrate plane which coincides with an object plane 101 of an objective lens 102 of an objective arrangement 100.

The primary electron beamlets 3 are generated by an arrangement 300 comprising an electron source 301 and a collimating lens 303, and further comprising a first pair of electrodes configured as an aperture plate arrangement APA, a blanking plate BP and an objective lens 307.

The electron source 301 generates a diverging electron beam 309 which is collimated by collimating lens 303 to form a beam 311 for illuminating aperture plate arrangement APA.

Insert $I_3$ of FIG. 1 shows an elevational view onto the aperture plate arrangement APA constituting the first pair of electrodes. Aperture plate arrangement APA comprises a first multi aperture plate 330 having a plurality of apertures 330 formed therein. The centers of apertures 330 are arranged in a pattern 319 which electron-optically corresponds to pattern 103 of the primary electron beam spots 5 formed in object plane 101.

The aperture plate arrangement APA further comprises a second multi aperture plate which is not illustrated in FIG. 1 for sake of simplicity. The aperture plate arrangement APA employed in the depicted system is shown in greater detail in FIGS. 4, 5 and 6.

In order to convey an impression of the dimensions of such a system, pitch $P_3$ of array 319 may be in a range of 5 μm to 200 μm, for instance. Diameters D of apertures 320 may be in a range of $0.2 \times P_3$ to $0.9 \times P_3$, for instance.

Electrons of illuminating beam 311 passing through apertures 330 form primary electron beamlets 3. Electrons of illuminating beam 311 impinging on the first multi aperture plate 320 of the aperture plate arrangement APA are intercepted from a primary electron beam path 13 and do not contribute to the formation of the primary electron beamlets 3.

In an alternative embodiment, the beamlet generating arrangement may further comprise an aperture plate for forming charged particle beamlets upstream of the aperture plate arrangement APA. This embodiment has the advantage that heating of the first multi aperture plate of the aperture plate arrangement may be greatly reduced to the fewer electrons impinging on a surface between apertures.

In the depicted embodiment, it is one function of the aperture plate arrangement to form the plurality of primary electron beamlets 3 from the illuminating beam 311. The aperture plate arrangement APA additionally has the function to focus each primary electron beamlet 3 such that foci are generated in a focal plane downstream of the aperture plate arrangement APA. The additional function of the aperture plate arrangement APA in the first and second modes of operation will be described in more detail with reference to FIGS. 4 to 6.

In FIG. 1, a blanking plate BP comprising plural apertures 340 is arranged in the focal plane such that foci of the primary charged particle beamlets coincide with centers of apertures 340 of the blanking plate BP. The blanking plate BP serves as the beam stop. Insert $I_4$ of FIG. 1 shows an elevational view onto the blanking plate BP and thus the focal plane with foci coinciding with centers of apertures 340. The centers of the apertures 340 are arranged in a pattern that corresponds to the pattern 319 of the first aperture plate 302. Diameters of the depicted foci may be in a range of from about 10 nm to about 1 μm, for instance.

Objective lens 307 and objective lens 102 serve to image the focal plane onto object plane 101 to form an array 103 of primary electron beam spots 5 having a small diameter on the substrate S.

Insert $I_1$ of FIG. 1 shows an elevational view onto object plane 101 showing a regular rectangular array 103 of primary electron beam spots 5 formed thereon. The embodiment depicted in FIG. 1 shows twenty-five primary electron beam spots 5 arranged in a 5×5-array. This number of primary electron beam spots was chosen to be relatively low for sake of simplicity and only serves to illustrate the principles of the electron microscopy system 1. In practice, the number of primary electron beam spots may be chosen to be substantially higher, such as 30×30, 100×100 or any other.

In the illustrated embodiment, the array 103 of primary electron beam spots 5 is a substantially regular rectangular array with a substantially constant pitch. $P_1$ in a range of from about 1 µm to about 10 µm. It is, however, also possible that the array 103 may be a distorted regular array or an irregular array or an array of some other symmetry, such as a hexagonal array.

A diameter of the primary electron beam spots formed in the object plane 101 may be in a range of 5 nm to 200 nm, for instance. The focusing of the primary electron beamlets 3 to form the primary electron beam spots 5 is accomplished by the objective arrangement 100.

The primary electrons incident on the substrate S at the beam spots 5 generate secondary electrons emanating from the surface of substrate S. The secondary electrons form secondary electron beamlets 9 which enter objective lens 102. The electron microscopy system 1 further provides a secondary electron beam path 11 to allow the plurality of secondary electron beamlets 9 traveling further to a detector arrangement 200.

In addition, a, beam splitter/combiner arrangement 400 is provided in the primary electron beam path 313 in between the arrangement 300 and objective arrangement 100 and in a secondary electron beam path 11 in between the objective arrangement 100 and the detector arrangement 200.

Detector arrangement 200 comprises a projecting lens arrangement 205 for projecting the secondary electron beamlets 9 onto a surface plane 211 of an electron sensitive detector 207 of a detector assembly 209.

Insert $I_2$ of FIG. 2 shows an elevational view on the surface plane 211 of detector 207, where secondary electron beam spots 213 are formed as an array 217. A pitch $P_2$ of the array may be in a range of 10 µm to 200 µm, for example. The detector 207 is a position-sensitive detector having a plurality of detecting pixels 215. The pixels 215 are arranged in an array matching array 217 formed by the secondary electron beam spots 213 such that each pixel 215 can detect an intensity of an associated secondary electron beamlet 9. The detector 207 can be one or more selected from a solid state CCD or CMOS, a scintillator arrangement, a micro channel plate, an array of PIN diodes and others.

Thus, high resolution secondary electron images may be taken by detecting intensities of secondary electron beamlets 9 by detector assembly 209.

Figure 2A:
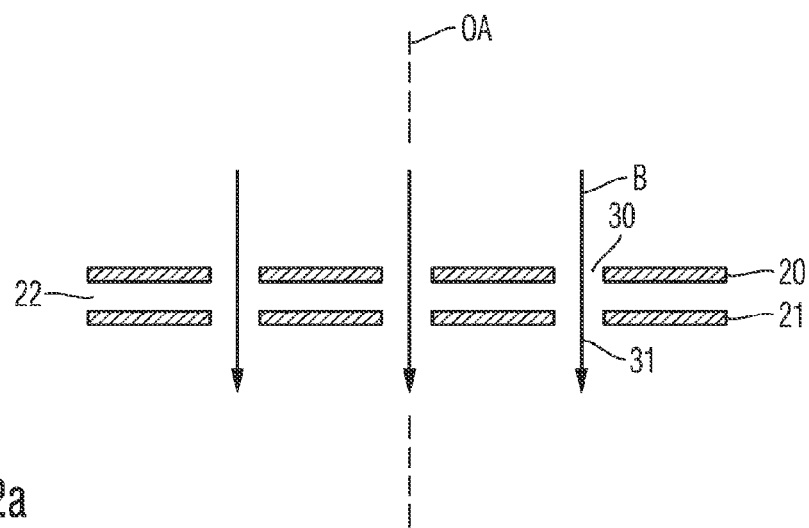
FIGS. 2a and 2b illustrate two examples of arrangements of multi aperture plates known from the prior art.
Figure 2B:
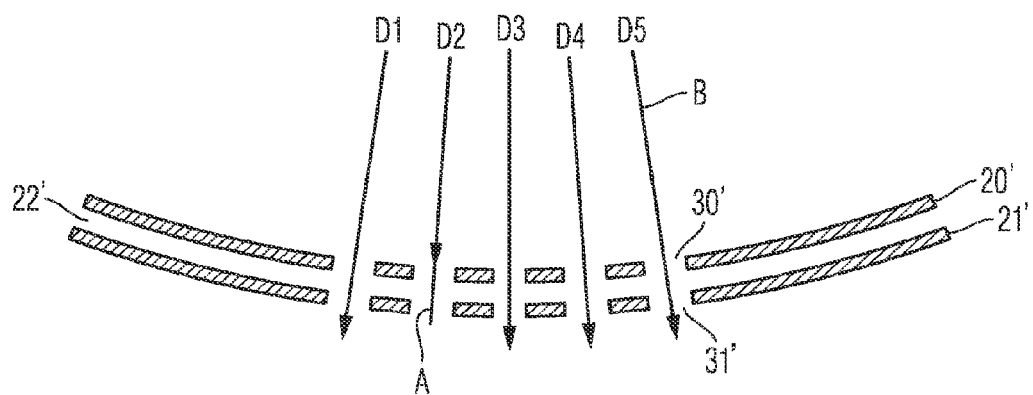

In FIGS. 2a and 2b, two examples of possible configurations of multi aperture plate arrangements known from the prior art are shown. The first and a second flat multi aperture plates 20, 21 may be arranged in parallel to form aperture plate arrangement 22. The first and second multi aperture plates 20, 21 are arranged so as to form a gap between them and are further arranged to be substantially orthogonal to a general direction of charged particle beamlets in a system they are comprised in. Each multi aperture plate 20, 21 comprises a respective plurality of apertures 30, 31 which are configured and aligned such that they form respective pairs of aligned apertures 30, 31, through which a respective one of plural charged particle beamlets B directed at the aperture plate arrangement 22 may pass. In the depicted embodiment, the first and second multi aperture plates each have a configuration that allows bringing the apertures 30, 31 in the first and second multi aperture plates 20, 21 into registry, resulting in axes extending through respective centers of aligned apertures 30, 31 of a pair coinciding. In other words, when seen in a projection orthogonal to the first multi aperture plate, the centers of the apertures of an alignment pair coincide.

In an alternative embodiment, as illustrated in FIG. 2b, an aperture plate arrangement 22' having a different configuration is provided, which, however, principally resembles that shown in FIG. 2a. The aperture plate arrangement 22' of FIG. 2b comprises curved first and second multi aperture plates 20', 21' having convex shapes. Adjacent surfaces of the first and second multi aperture plates 20' are arranged substantially in parallel. This kind of configuration may be particularly advantageous when a charged particle source generates a diverging beam of charged particles or a plurality of charged particle beamlets such that they approach the aperture plate, arrangement 22' at various angles. As shown in FIG. 2b, each charged particle beamlet B can be associated 'with a predetermined direction D1 through D5 at which it is directed at the aperture plate arrangement 22'. A reference point chosen for indication of a direction may be arbitrary, as long as the reference point allows distinguishing between the various directions. In the embodiment shown in FIG. 2b, each aperture 30' of the first aperture plate has an aperture 31' associated and aligned therewith, the apertures 30', 31' being aligned such that their centers are disposed on a same axis A, with axis A being arranged to run parallel to a respective direction D1 through D5 in which charged particles approach that pair of aligned apertures 30', 31'.

Figure 3A:
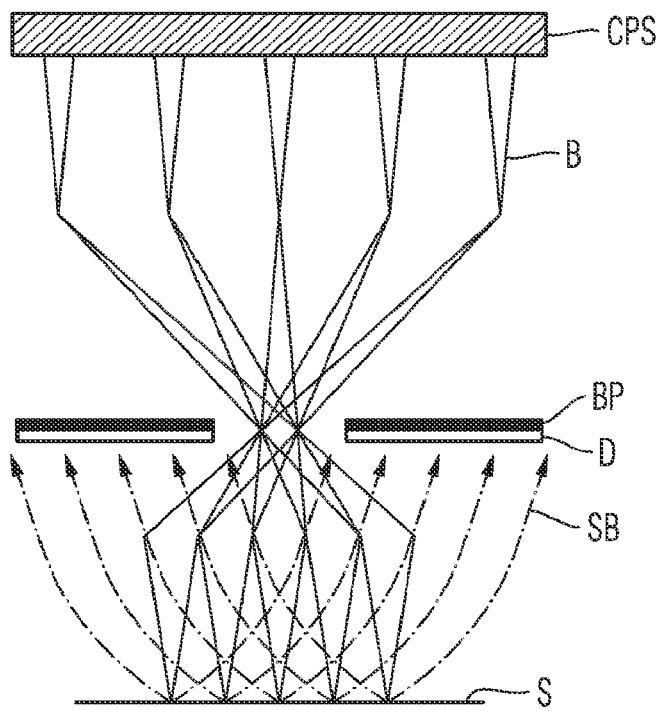
FIGS. 3a and 3b illustrate a concept underlying the system and method according to embodiments of the present invention.
Figure 3B:
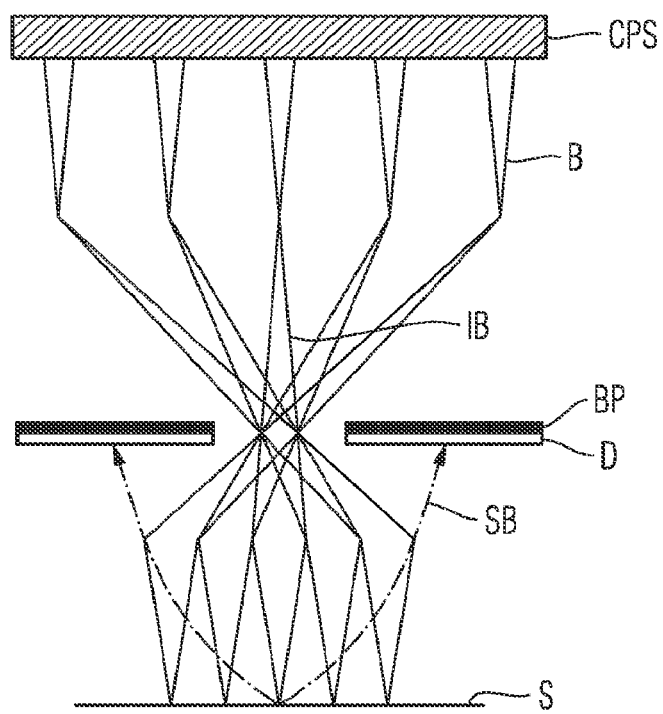

In FIGS. 3a and 3b, a concept underlying the first and second embodiments and some examples of the third and fourth embodiments of the present invention is schematically illustrated: As shown in FIG. 3a, a first number of five primary charged particle beamlets is directed at the object surface generating, secondary charged particle beamlets SB which are then incident on detector arrangement D where an intensity of each of the secondary charged particle beamlets is detected. In other words, in FIG. 3a, the charged particle system is set to a first mode of operation wherein the first number of primary charged particle beamlets B is generated by charged particle source CPS and allowed to pass through an aperture in blanking plate BP so that they can reach the object surface S.

In FIG. 3b, the second number of charged particles comprises just one primary charged particle beamlet that is directed at the surface of the object S. Thus, the system is set to the second mode of operation, wherein a third number of the generated primary charged particle beamlets B is blocked by blanking plate BP from reaching the object S, as indicated by broken lines. Only one (the second number) of the charged particle beamlets B, the inspection charged particle beamlet IB is allowed to reach the object surface S for investigating an effect that exposure to all charged particle beamlets B in a first mode of operation exerts on the object. Secondary charged particles SB are detected by detector arrangement D which is disposed adjacent to the blanking plate BP on an object facing side thereof. Use of this principle in a system according to the embodiment of FIG. 1 allows detection of an intensity of each secondary charged particle beamlet generated by a primary charged particle beamlet impinging on the object surface.

Figure 4:
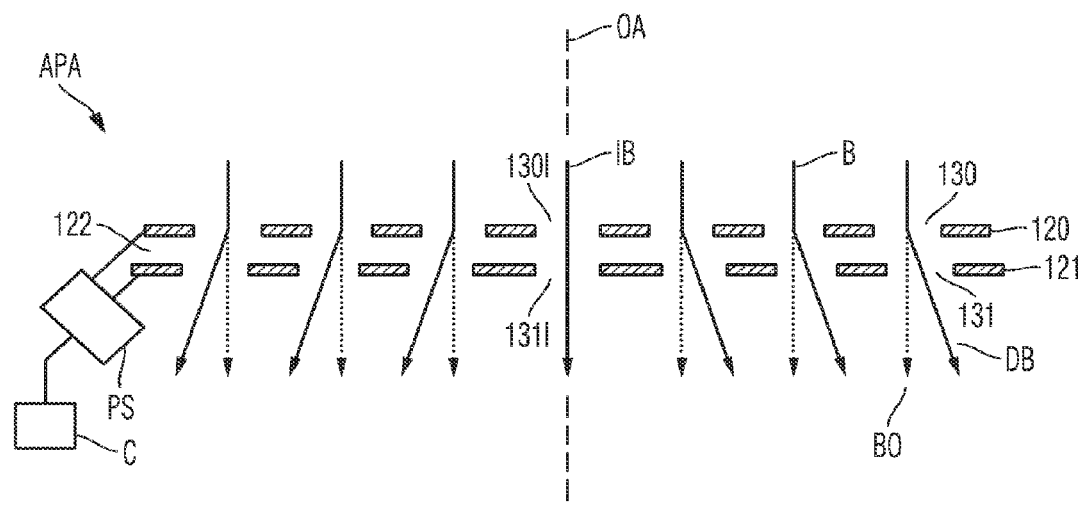
FIG. 4 illustrates a schematic cross-section of an arrangement of the first and second multi aperture plates for use in exemplary embodiments of the present invention.

In FIG. 4, an embodiment of a suitable arrangement of a pair of electrodes in the form of an aperture plate arrangement APA is shown. The aperture plate arrangement APA comprises first and second multi aperture plates 120, 120', which are substantially plane plates comprising plural apertures 130, 131 each. The first and second multi aperture plates 120, 212 are arranged in parallel and form a gap 122 between them. The first and second aperture plates 120, 212 are further disposed orthogonally with respect to an optical axis of a system (not depicted) they are comprised in, the optical axis OA also representing a general direction from which charged particles are directed at the aperture plate arrangement APA. As can be seen in FIG. 4, only central apertures 130I and 131I of the first and second aperture plates 120, 121 are aligned such that their centers are disposed on an axis which coincides with an orientation of the optical axis OA. In other words, the centers of apertures 130I, 131I coincide, when the first multi aperture plate is viewed from a direction orthogonal to the first multi aperture plate. The other apertures 130, 131 of the first and second aperture plates 120, 121 also form aperture pairs, but with centers of apertures 131 of the second multi aperture plate 121 being displaced relative to centers of corresponding apertures 130 of the first multi aperture plate 120. Thus, in each such aperture pair, a center of the aperture 131 in the second aperture plate 121 is offset in a direction orthogonal to the optical axis OA from a center of the associated aperture 130 in the first aperture plate 120. The distance by which the centers of the apertures of each aperture pair thus aligned are offset from one another is chosen such that charged particles approaching the aperture plate arrangement APA in a direction of the optical axis' may still traverse each such aperture pair in a straight path, despite the apertures being not in complete registry.

The paths that the charged particle beamlets B take upon passing through the aperture arrangement APA in the second mode of operation in which a second voltage of zero, i.e. no potential difference is applied to the pair of electrodes of the aperture plate arrangement APA, is indicated by dotted lines B0.

Upon switching the system to the first mode of operation by setting voltage supply PS to apply a first voltage to the first and the second multi aperture plates 120, 121, the charged particle beamlet IB traversing the central apertures 130I, 131I of the first and the second multi aperture plates 120, 121 remains substantially unaffected and is therefore not deflected by the electrical field generated in between the first and multi aperture plates 120, 121. On the other hand, the charged particle beams B passing through the other apertures 130, 131 of the first and second multi aperture plates 120, 121 are deflected as a result of the particular arrangement of the apertures 130, 131 in the individual aperture pairs. Thus, charged particle beamlets B having approached the aperture plate arrangement APA from a direction parallel to the optical axis exit from the apertures 130, 131 of the aperture plate arrangement APA as deflected charged particle beamlets DB which travel at an angle with respect to the optical axis OA. The voltage supply PS and thus the applied voltage is controlled by controller C.

Figure 5:
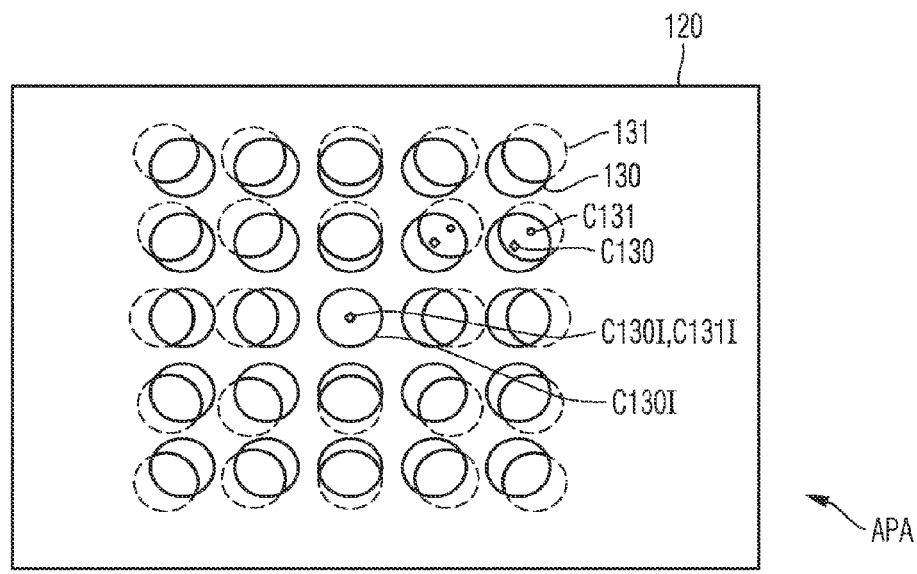
FIG. 5 illustrates a schematic elevational view onto the aperture plate arrangement shown in FIG. 4.

In FIG. 5, an elevational view onto the first aperture plate 120 and a portion of the second aperture plate 121 disposed underneath is shown. This view represents the view orthogonal to the first multi aperture plate used for defining an arrangement of centers of apertures relative to one another. Each aperture 130 of the first aperture plate 120 has a center C130, indicated by a diamond shape in a few apertures. Likewise, each aperture 131 of the second aperture plate 121 has a center C131, as indicted by a circle for a few apertures. The central apertures 130I and 131I are aligned such that their centers C130I, C131I coincide, i.e. such that the apertures 130I, 131I are in registry. Therefore, a rim of aperture 131I is not visible when seen from the elevational view, since it is entirely covered by a rim of aperture 130I. In contrast, in all other aperture pairs, i.e. pairs of aligned apertures 130,131 in the depicted embodiment, a center C131 of an aperture in the second aperture plate 121 is displaced relative to a center C130 of a corresponding aligned aperture 130 in the first aperture plate 120. Therefore, a portion of a rim of aperture 131 is visible through aperture 130, with a remainder of the rim of aperture 131 being hidden from view in this direction, as indicated by a broken line. In order to obtain an aperture arrangement of that kind, the apertures 130 of the first aperture plate 120 are arranged in a first pattern which is different from a second pattern of apertures 131 in the second aperture plate 121. In the illustrated embodiment, the patterns differ in that any aperture 131 of the second aperture plate 121 has a greater distance from a center C131I of the central aperture 131I than the distance that a corresponding aligned aperture 130 in the first aperture plate 120 has from the center C130I of the central aperture 130I in the first aperture plate 120.

Figure 6:
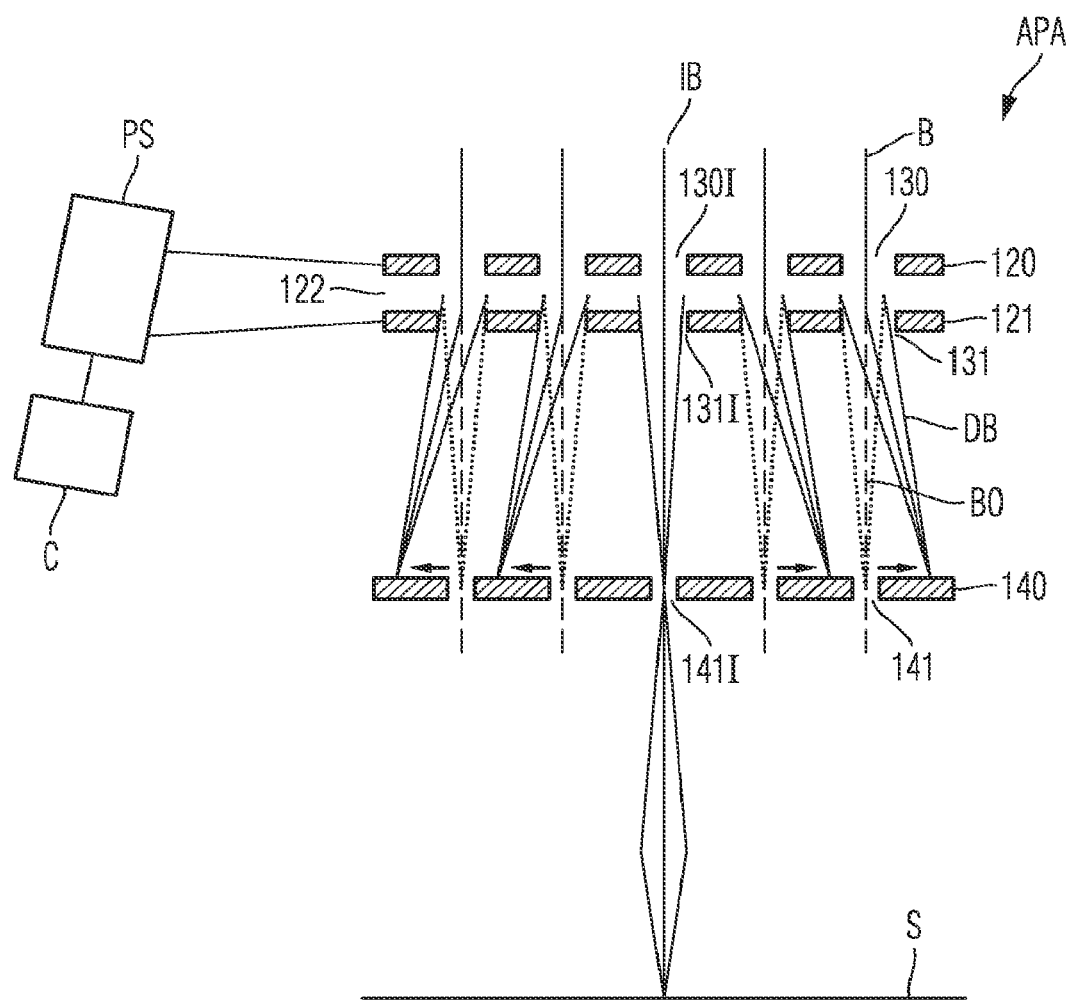
FIG. 6 illustrates the aperture plate arrangement of FIG. 4 in connection with a beam stop comprising an aperture plate comprising multiple apertures.

FIG. 6 shows the aperture plate arrangement APA of FIGS. 4 and 5 in combination with a blanking plate 140 comprising multiple apertures 141. Each aperture 141 of the blanking plate 140 is aligned with a respective pair of apertures 130, 131 of the first and second aperture plates 120, 121. In the depicted embodiment, a radius of each aperture 141 of the blanking plate 140 is smaller than any radius of the plural apertures 130, 131 in the aperture plate arrangement APA.

In a second mode of operation, upon application of a second voltage to the first and to the second aperture plates 130, 131, charged particle beamlets B passing through apertures 130, 131 are deflected due to the electrical field generated in the gap 122 between the first and second aperture plates 120, 121, with the exception of charged particle beamlet IB passing through the central apertures 130I, 131I which remains substantially unaffected by the electrical field. Blanking plate 140 is arranged with respect to the second aperture plate 121 and configured in terms of positions of the apertures 141 such that the deflected charged particle beams DB impinge on the blanking plate 141 and are blocked from reaching the object surface S. Meanwhile, the unaffected central beam IB serves as the single inspection beam, since the lack of deflection permits it to pass through aperture 141I of the blanking plate 140 and reach the object surface S. Thus, the second number of primary charged particle beamlets is one, with the third number of charged particle beamlets being intercepted by the blanking plate 140 amounting to four.

In a first mode of operation, wherein the voltage supply PS is switched off, i.e. set to apply a first voltage of zero to the first and second aperture plates 120,121, the first number of charged particle beamlets B passes through apertures 130, 130I, 131, 131I. They exit from the aperture plate arrangement APA in substantially straight paths as primary charged particle beamlets B0, as indicated by dotted lines. The charged particle beamlets B0 may then pass through respective apertures 141 of the blanking plate 140 and reach the object surface S for exposure or examination purpose thereof (not shown). Thus, the first number of five primary charged particle beamlets B0 is directed at the object surface S.

Figure 7:
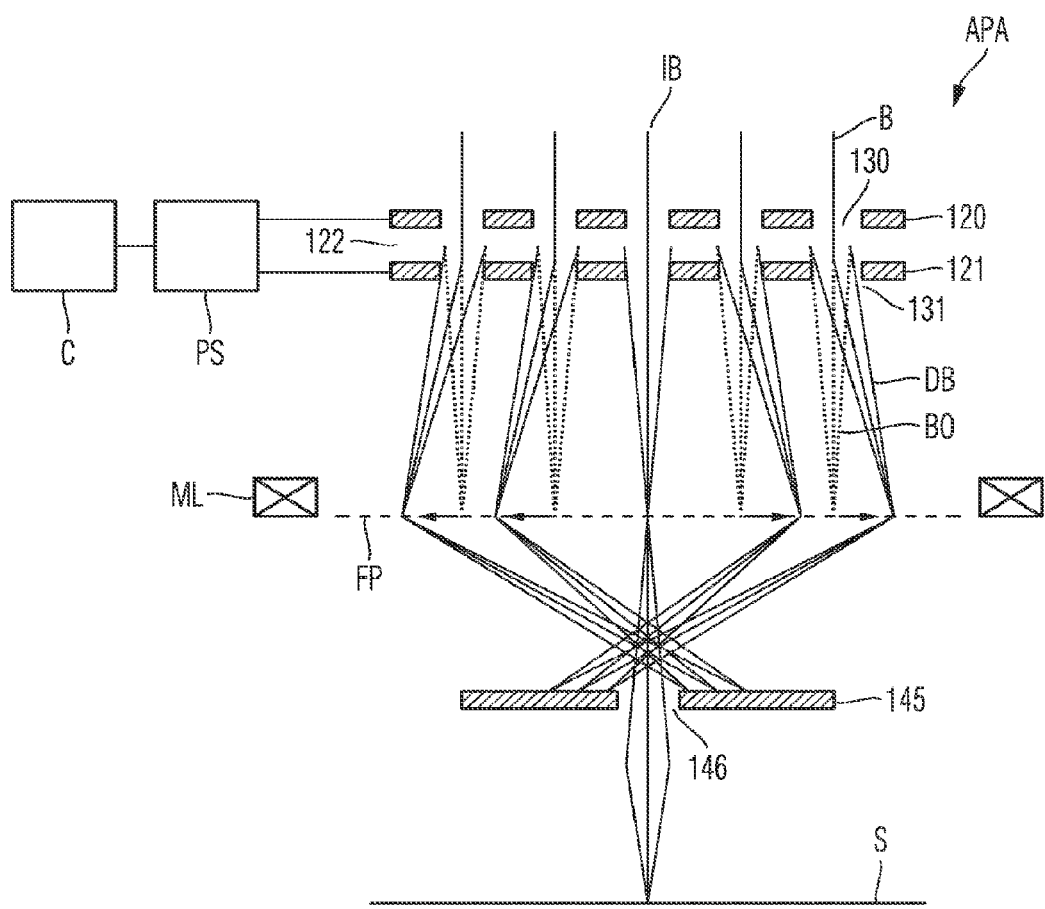
FIG. 7 illustrates the aperture plate arrangement of FIG. 4 in connection with a beam stop having a single aperture.

In FIG. 7, the aperture arrangement APA of FIGS. 4 and 5 is employed in combination with a blanking plate 145 comprising only one aperture 146. The charged particle beamlets B are focused by the aperture plate arrangement APA into a focal plane FP. A magnetic lens ML is disposed in a region of the focal plane FP and around beam paths of the primary charged particle beamlets B. The magnetic lens ML is configured to direct the primary charged particle beamlets towards and through the aperture 146 of the blanking plate 145.

In a first mode of operation, wherein a first voltage of zero, i.e. no potential difference is applied to the first and second aperture plates 120, 121, charged particle beamlets B exiting from the aperture plate arrangement APA are undeflected charged particle beams B0, as indicated by dotted lines and follow substantially straight paths down to the focal plane FP. Deflection caused by the magnetic lens ML causes the charged particle beamlets B0 in the first mode of operation to be transmitted through the aperture 146 of the blanking plate 145 and to reach the object surface S. Their beam paths downstream of the focal plane FP is not shown in FIG. 7, but may be derived from FIG. 3b, which shows beam paths similar to the ones of the embodiment shown in FIG. 7.

In a second mode of operation, a second voltage is applied to the pair of first and second aperture plates 120, 121 resulting in a deflection of all charged particle beamlets B with the exception of a central charged particle beamlet IB, as described before with reference to FIGS. 4 and 6. Positions of foci of the deflected charged particle beamlets DB are therefore shifted in the focal plane FP. Deflection by the magnetic lens ML subsequently results in the deflected charged particle beamlets DB being directed onto the blanking plate BP and thus blocked from reaching the substrate S. Only the central charged particle beam IB is unaffected and reaches the substrate S. It may therefore be used for inspection purposes in this mode of operation. A detector arrangement may be disposed downstream of the blanking plate and adjacent to it, for instance (not shown).

Figure 8A:
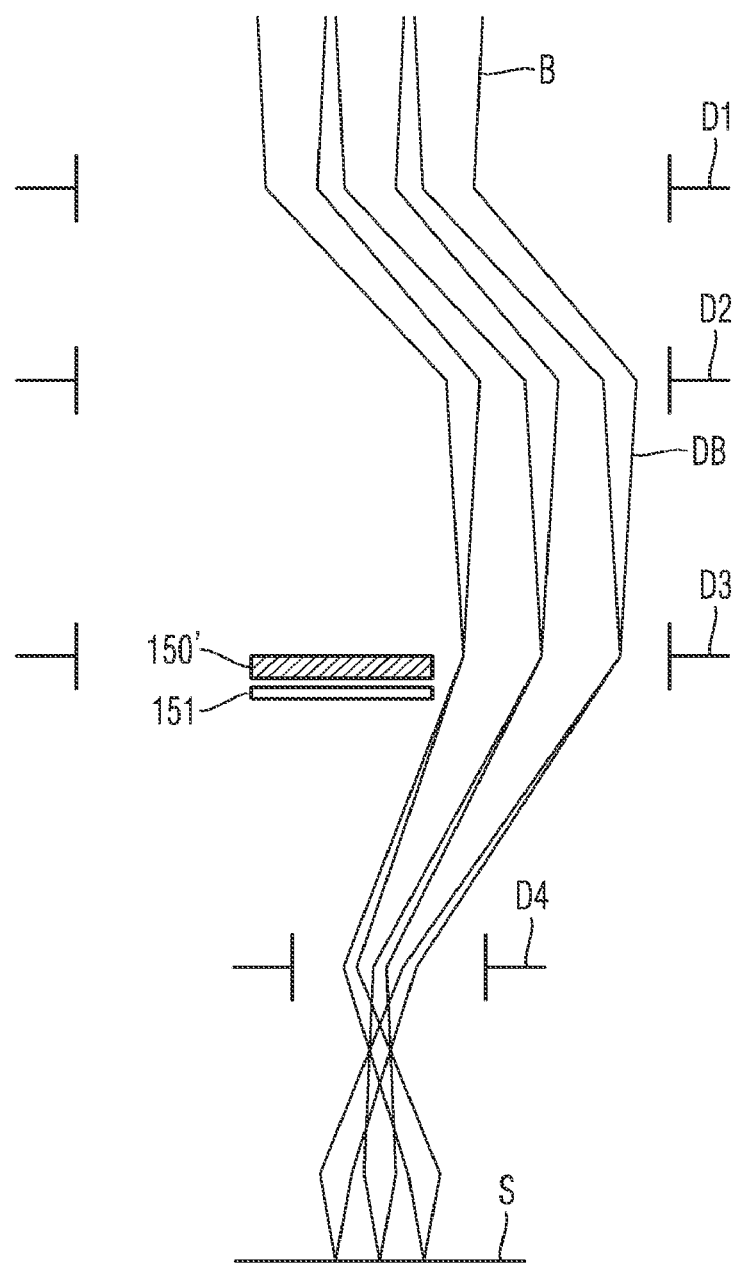
FIG. 8a shows a schematic cross-section of a further exemplary embodiment of a system according to the present invention in a second mode of operation.
Figure 8B:
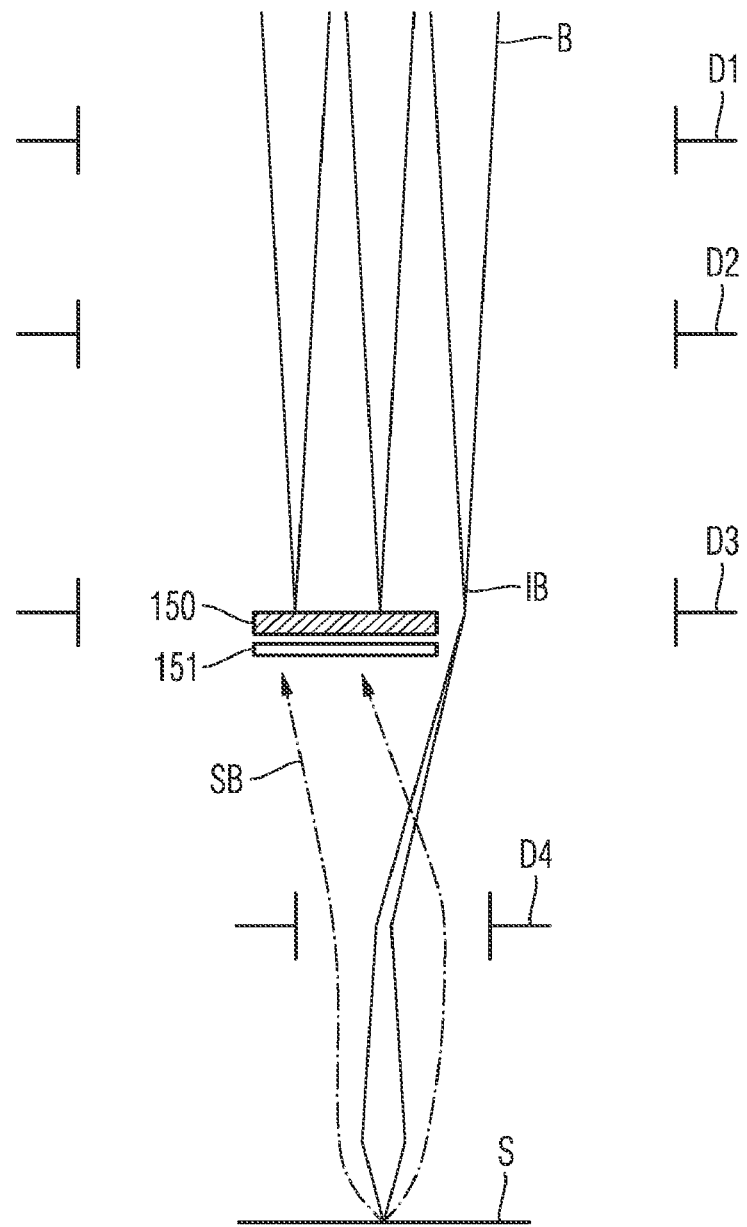
FIG. 8b shows the schematic cross-section of FIG. 8a switched into a first mode of operation.

FIGS. 8a and 8b illustrate an alternative exemplary embodiment. The charged particle system of that embodiment comprises a source of charged particle beamlets (not shown) for generating charged particle beamlets B, a blanking plate 150, a detector 151 disposed downstream of and adjacent to the blanking plate 150, and a deflector arrangement comprising four pairs of electrodes D1, D2, D3 and D4. The first and second pairs of electrodes D1 and D2 are arranged upstream of the blanking plate 150. They are spaced apart from another in a direction of an optical axis of the system (not indicated). The third pair of electrodes D3 Is arranged in approximately a same plane as the blanking plate 150, and the fourth pair of electrodes D4 is disposed downstream of blanking plate 150 and detector 151.

In a first mode of operation, as shown in FIG. 8a, the pairs of electrodes D1 through D4 are activated, i.e. a predetermined voltage is applied to each of them. A first voltage is applied to the first pair of electrodes D1. Thus, the pairs of electrodes D1 through D4 generate electrical fields upstream and downstream of the blanking plate 150. The first and second pairs of electrodes D1 and D1 provide an electrical field that causes the primary charged particle beamlets B passing through it to be deflected. This deflection and the resulting shift in position allow the deflected charged particle beamlets to pass around the blanking plate 150. The third and fourth pairs of electrodes D3, D4 serve to focus and redirect the deflected charged particle beamlets DB onto the substrate S, thus taking the function of an objective lens.

FIG. 8b shows the system set to a second mode of operation, in which a second voltage of zero is applied to the first and second pairs of electrodes. D1 and D2, resulting in the electrical field generated between them being switched off. In the absence of an electrical field upstream of the blanking plate 150, the charged particle beamlets B travel in straight paths towards the substrate S. The blanking plate 150 is disposed such that it blocks the majority of charged particle beamlets B (the third number) from reaching the substrate S. In the depicted embodiment, only one charged particle beamlet IB can pass by the blanking plate 150 and reach the substrate S. Thus, the second number is one. In the depicted embodiment, pairs of electrodes D3 and D4 serve to focus and redirect the charged particle beamlet IB to a central portion of substrate S. This single charged particle beamlet impinges on the substrate S, causing secondary charged particles to be emitted which travel towards the detector 151, assisted by the electrical field generated within the fourth pair of electrodes D4. Thus, the intensity of secondary charged particles resulting from impinging primary charged particles can be detected. The primary charged particles in the first mode of operation may be used to inspect the substrate or may alternatively be used to expose the substrate for generation of a microstructure thereon.

Figure 9:
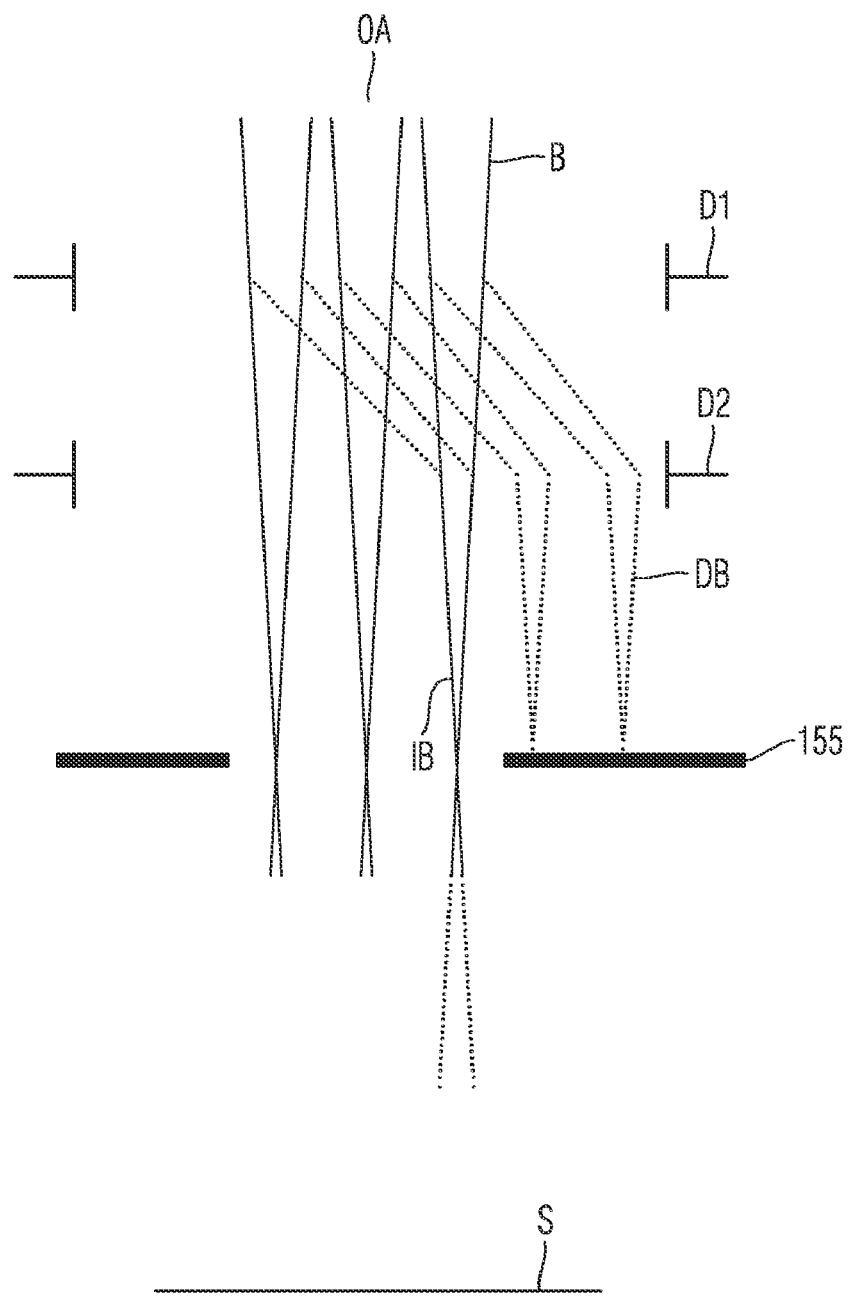
FIG. 9 shows a further embodiment of a system according to the present invention.

FIG. 9 shows a further, alternative embodiment. In this embodiment, a source of charged particle beamlets (not shown) and a blanking plate 155 comprising an aperture for transmitting the charged particle beamlets is provided. First and a second pairs of electrodes D1, D2 are arranged upstream of the blanking plate 155 and are laterally disposed about beam paths of the first number of electron beamlets. In addition, they are spaced apart in a general direction of travel of the electron beamlets. Components downstream of the blanking plate 155 are not depicted in this illustration for sake of simplicity. An objective lens and a detector would generally be provided downstream of the blanking plate 155.

In a first mode of operation, the first and second pairs of electrodes D1 and D2 are deactivated, i.e. a first voltage of zero is applied thereto, such that the charged particle beamlets B may travel in straight beam paths through the aperture of the blanking plate 155 and onto the substrate S. Thus, a first number of charged particle beamlets B reaches the substrate S.

In a second mode of operation, a second voltage is applied to each of the first and second pairs of electrodes D1 and D2 such that they generate an electrical field upstream of the blanking plate 155. The generated electrical field causes a deflection of the charged particle beamlets B to such an extent that their positions in a plane orthogonal to the optical axis OA is shifted, such that only one charged particle beamlet IB in the depicted embodiment may still pass through the aperture of the blanking plate 155 and reach the substrate S, whereas the other deflected charged particle beamlets DB impinge on the blanking plate 155 and are blocked from traveling further. The singled out charged particle beamlet IB may be suitably used for inspection of the substrate S. For instance, a detector could be disposed downstream of the blanking plate 155, in a similar way as in the embodiment shown in FIGS. 8a and 8b.

In the embodiment of FIG. 9, downstream of the beam stop 155, a beam path of one of the primary charged particle beamlets bypassing the beam stop 155 in the first mode of operation coincides with one of the primary charged particle beamlets bypassing the beam in the second mode of operation.

Figure 10:
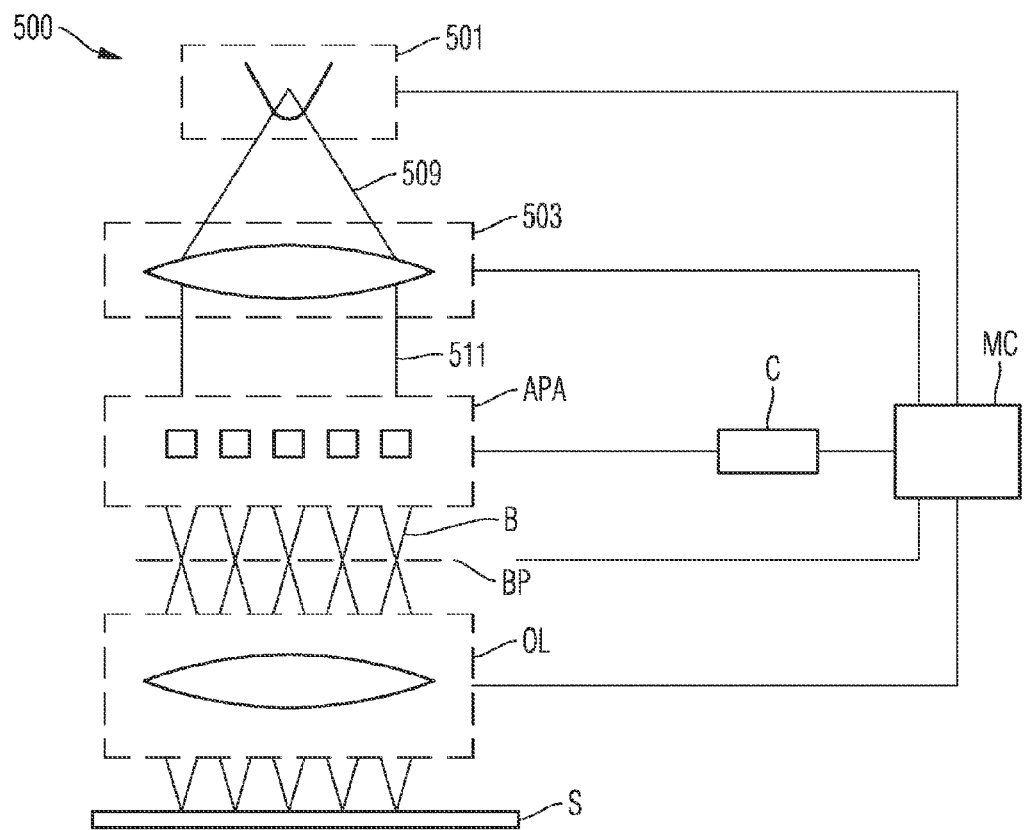
FIG. 10 shows another embodiment of a system according to the present invention configured as a lithography system.

In FIG. 10, components of an exemplary embodiment of a system according to the present invention configured as a lithography system are schematically illustrated. In the depicted embodiment, lithography system 500 comprises, in a direction in which electrons would generally travel, an electron source 501 with an extraction system and condenser lens 503. The condenser lens 503 may, for instance, comprise a stack of electrodes. Like in the embodiment shown in FIG. 1, the electron source 501 generates a diverging electron beam 509 which is collimated by collimating lens 503 to form a beam 511 that is subsequently incident on aperture plate arrangement APA. In the depicted embodiment of the lithography system 500, the aperture plate arrangement APA may be the one shown in FIGS. 4 to 6, with the exception that for purposes of the lithographic process, the first aperture plate is configured as a blanking aperture array, such that each aperture of the first aperture plate is provided with a set of deflection elements allowing individual control of electron beamlets passing through it. Downstream of the thus modified aperture plate arrangement APA, a blanking plate BP comprising plural apertures is disposed in a focal plane of electron beamlets formed by the aperture plate arrangement APA. This arrangement corresponds largely to that described in more detail with reference to FIG. 1 above. The lithography system 500 further comprises an objective lens arrangement OL for focusing the electron beamlets B onto the substrate S. The objective lens arrangement OL may, for instance, comprise an electrostatic lens arrangement and an electromagnetic focussing lens arrangement, which are generally known in the art. The embodiment illustrated in FIG. 10 further comprises a main controller MC configured to control settings of the electron source 501, the condenser lens 503, the blanking plate BP, the objective lens arrangement OL in dependence of a mode of operation to which the system is switched, i.e. in dependence of a setting of controller C, to which the main controller MC is also coupled.

Figure 11:
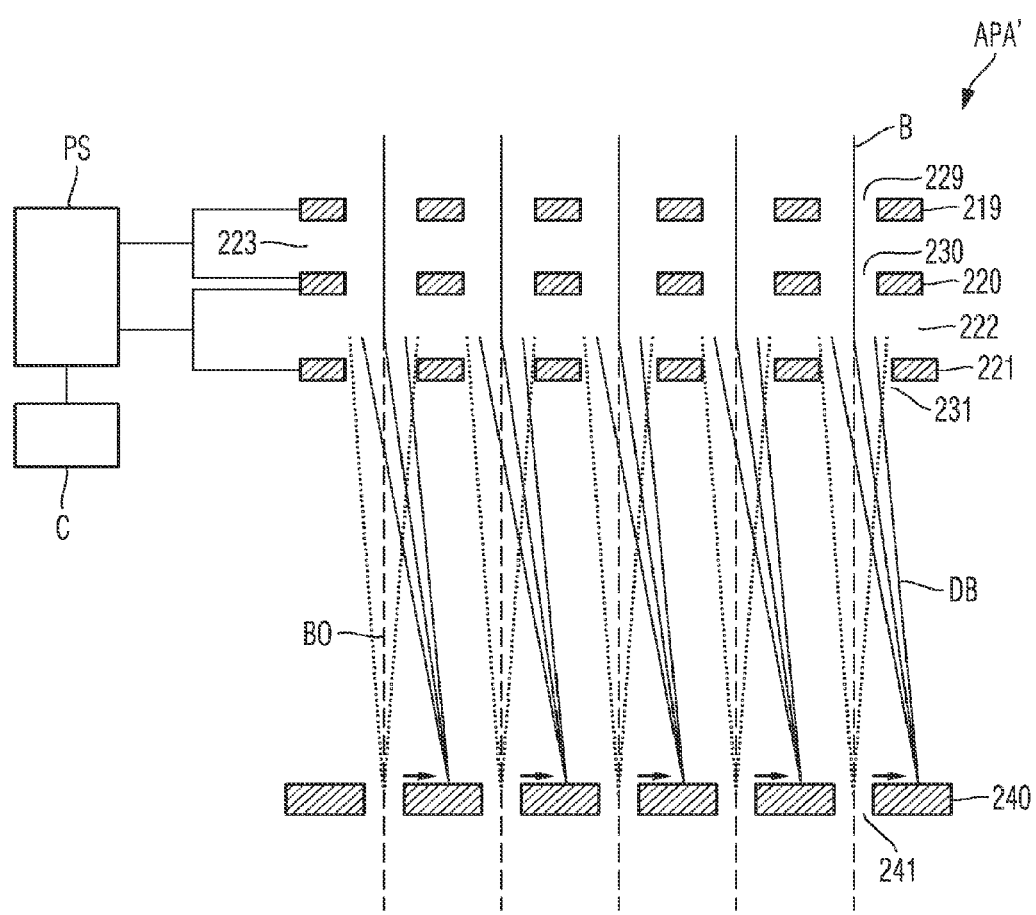
FIG. 11 shows another embodiment of a system according to the present invention.

FIG. 11 shows an embodiment of the present invention which is configured as a general blanker, i.e. which serves to blank all charged particle beamlets from reaching the substrate in one mode of operation, and which may also serve as a focussing element. In the embodiment depicted in FIG. 11, a stack of a first multi aperture plate 220, a second multi aperture plate 221, and a third multi aperture plate 219 is shown. The first, second and third multi aperture plates 220, 221, 219 have the same pattern of apertures formed therein. The first multi aperture plate 220 is aligned with the third multi aperture plate 219 such that centers of associated apertures of aperture pairs are in registry when seen in a direction of incidence of the primary charged particle beamlets B, i.e. when seen in a direction orthogonal to the first multi aperture plate 220. The second multi aperture plate 221 is shifted relative to the first multi aperture plate 220 such that in each aperture pair, a center of the aperture in the first multi aperture plate is offset by a predetermined distance from a center of the associated aperture in the second multi aperture plate 221. In the depicted embodiment, the stack of the first, second and third multi aperture plates 220, 221, 219 is also symmetric in that a gap 223 formed between the first and third multi aperture plates 219, 220 and a gap 222 formed between the first and second multi aperture plates 220, 221 have about equal widths. A beamstop comprising a further multi aperture plate 240 is disposed at a distance downstream of the second multi aperture plate 221. A pattern of apertures 241 in the multi aperture plate 240 of the beamstop corresponds to the pattern of the first, second and third multi aperture plates 220, 221, 219 with the exception of the apertures of the multi aperture plate 240 of the beamstop having smaller aperture diameters. As illustrated in FIG. 11, a center of each aperture 214 of the multi aperture plate 240 of the beamstop coincides with a center of an associated aperture 231 in the second multi aperture plate 221, when seen in a direction of incidence of the primary charged particle beamlets B, i.e. when seen in a direction orthogonal to a plane in which the second multi aperture plate 221 is disposed. A controller C is configured to control a power supply to selectively apply predetermined voltage differences between the first and third as well as the first and second multi aperture plates.

In a first mode of operation, an electrical field is generated in the gap 223 between the first and third multi aperture plates 220, 219 by application of a suitable voltage difference, whereas no electrical field is generated in the gap 222 between the first and second multi aperture plates 220, 221. Thus, in the first mode of operation, charged particle beamlets B passing through the stack of multi aperture plates are focused by the electrical field between the first and third multi aperture plates 220, 219 and pass along substantially straight paths as primary charged particle beamlets B0 through respective apertures 241 in the beamstop. Thus, a total first number of charged particles is incident on the object surface (not depicted). In a second mode of operation, no electrical field is generated in the gap 223 between the first and third multi aperture plates 220, 219, whereas an electrical field is generated in the gap 222 between the first and second multi aperture plates 221 by application of a suitable voltage difference. Due to the centers of the apertures 231 in the second multi aperture plate 221 being shifted with respect to the centers of the apertures 230 in the first multi aperture plate 220, the electrical field in the gap 222 results in a uniform deflection of the charged particle beamlets B passing through it. The charged particle beamlets B exit from the apertures 231 of the second multi aperture plate 221 as deflected beamlets DB which subsequently impinge on the beamstop 240 and are thus blocked from reaching the object surface. This embodiment is advantageous in that switching between a first and second mode of operation, i.e. between focusing and deflecting, my be achieved by switching a voltage applied to the first multi aperture plate 220, whilst the second and third multi aperture plates 219, 221 may be kept at a constant potential. Thus, fast and accurate switching is possible.

The aperture plate arrangement APA' shown in FIG. 11 may also be used as a deflection arrangement for fast, simultaneous and uniform deflection of all of the depicted charged particle beamlets in the same direction. In such an embodiment, the beamstop 240 need not necessarily be included.

Figure 12:
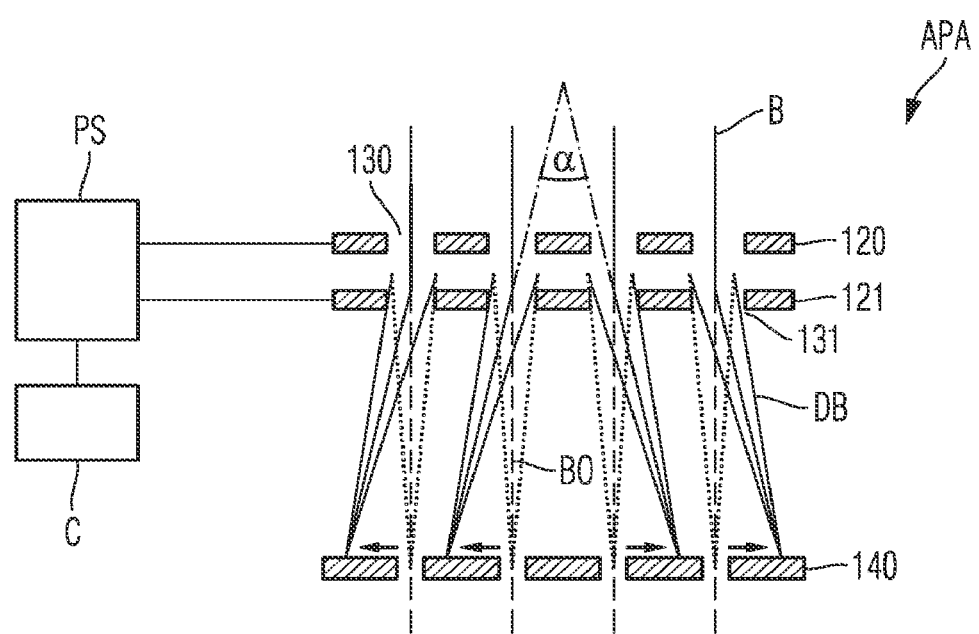
FIG. 12 shows a schematic cross-section of a further exemplary embodiment of a system according to the present invention.

FIG. 12 depicts an embodiment of a part of a system and a component of the present invention which is configured as a general blanker. In contrast to the embodiment depicted in FIG. 6, the first and second multi aperture plates 120, 121 have no aperture pair wherein a center of an aperture 130 of the first multi aperture plate 210 is aligned with a center of an associated aperture 131 of the second multi aperture plate 121, i.e. no coaxial apertures. Rather, all aperture pairs have their apertures arranged such that the centers of associated apertures in the first and second multi aperture plates 120, 121 are displaced relative to one another. The design and arrangement of the first and second multi aperture plates 120, 212, or of their apertures 130, 131, respectively, is such that the depicted charged particle beamlets traverse aperture pairs in a first mode of operation wherein no electrical field is generated in between the first and second multi aperture plates 120, 121 in substantially straight paths B0. The design and arrangement are further configured such that a first group of charged particle beamlets is deflected to the left hand side and a second group of charged particles is deflected to the right hand side, referring to the directions when viewing the illustration, when an electrical field is generated in between the first and second multi aperture plates 120, 121 in the second mode of operation. A direction of displacement of the respective aperture centers relative to one another corresponds to a direction of deflection of the charged particle beamlets DB. Thus, the embodiment shown in FIG. 12 represents a particle-optical component configured to transform parallel charged particle beamlets into a set of divergent charged particle beamlets, thus changing a divergence from zero to a positive divergence. Two adjacent charged particle beamlets B form an angle α between them which differs significantly from the angle zero they formed as parallel charged particle beamlets. Upon application of the electrical field in between the first and second multi aperture plates 120, 121 in the second mode of operation, the charged particle beamlets are deflected such that they impinge on blanking plate 140, which blocks them from reaching the object surface.

Figure 13:
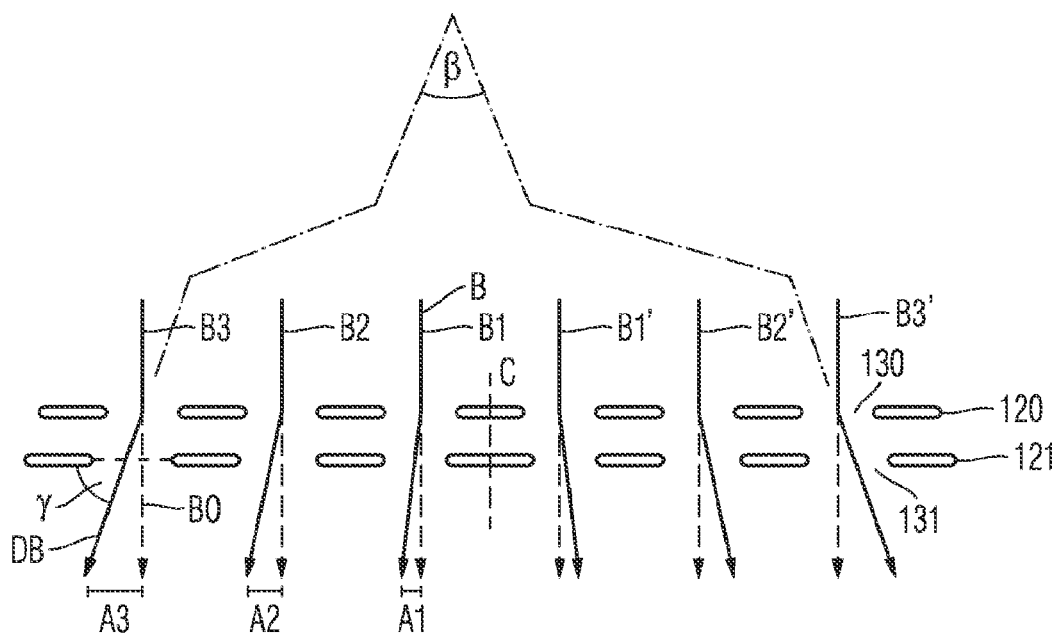
FIG. 13 shows a schematic cross-section of a further exemplary embodiment of a system according to the present invention.
Figure 14:
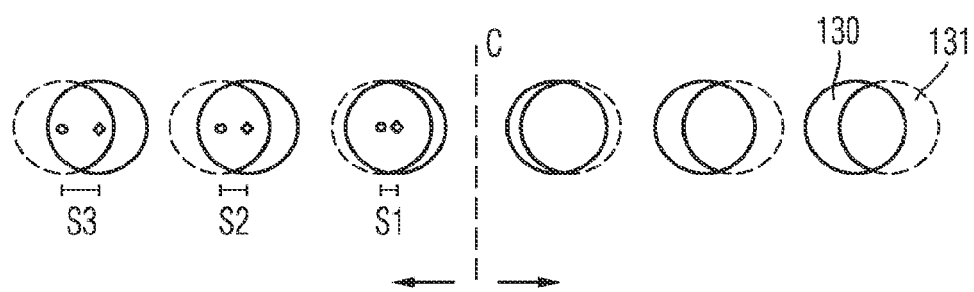
FIG. 14 illustrates a schematic elevational view onto the portion of the aperture plate arrangement shown in FIG. 13.

In FIG. 13, a further embodiment of a part of a system and a component according to the present invention is illustrated. A set of charged particles approaching the particle optical component comprising the first and second multi aperture plates 120, 121 as parallel charged particle beamlets B exit as a divergent set of charged particle beamlets DB from the component upon application of a voltage difference between the first and second multi aperture plates 120, 121 (voltage source not shown). The embodiment shown in FIG. 13 is modified with respect to the embodiment shown in FIG. 12 in that centers of associated apertures of aperture pairs are displaced to an increasing degree with increasing distance from a center C of the first multi aperture plate 120. The first and second multi aperture plates 120, 121 are accordingly configured and arranged such that the charged particle beamlets B1, B2, B3, B1', B2', B3' are deflected to a an increasing degree the further away from the center C of the first multi aperture plate 120 they traverse the multi aperture plates 120, 121. An angle formed between two peripheral charged particle beamlets in the second mode of operation upon application of an electrical field is illustrated as angle β (lines of beamlets forming angle shortened and shifted for ease of illustration). The angle β is significantly greater than the angle of zero between the two parallel charged particle beamlets B3, B3' impinging on the first multi aperture plate 120. In addition, the peripheral beam B3 forms an angle γ with the second multi aperture plate 121 upon exit from the electrical field generated between the first and second multi aperture plates 120, 121 which differs significantly from the angle of 90° between the undeflected charged particle beamlet B0 and the second multi aperture plate 121. As shown in FIG. 13, a degree of deflection, as indicated by distances A1 through A3 between undeflected charged particle beamlets B0 and deflected charged particle beamlets DB in a plane parallel to the multi aperture plates, increases with increasing distance from the center C of the first multi aperture plate 120. FIG. 14 shows an elevational view onto the first multi aperture plate 120 of the embodiment of FIG. 13 with edges of apertures 131 of the second multi aperture plate 121 being partially visible through the apertures 130 in the first multi aperture plate 120, and dashed lines indicating those parts of edges of the apertures 131 in the second multi aperture plate 121 that are not visible through the respective aperture 130 in the first multi aperture plate 120. FIG. 14 thus shows six alignment pairs that correspond to those depicted in FIG. 13. In the three alignment pairs to the left, in all alignment pairs the centers of apertures 131 in the second multi aperture plate 121 are displaced to the left with respect to a center of the associated aperture 130 of the first multi aperture plate 120. The opposite applies to the three alignment pairs on the right side of the center C, in which displacement is to the right, i.e. away from the center C. Centers of apertures 130 in the first multi aperture plate 120 are illustrated by diamond shapes, whereas centers of apertures 131 in the second multi aperture plate 121 are illustrated by circles. In the three left and the three right alignments pairs, a distance of displacement S1, S2, S3 between the respective centers of the apertures 130 in the first multi aperture plate 120 and the respective centers of the apertures 131 in the second multi aperture plate 120 increases with increasing distance from the center C of the first multi aperture plate 120. The arrangement of the depicted row of apertures is symmetric with respect to the center C. This design of multi aperture plates and arrangement relative to one another allows fast and simultaneous generation of a set of charged particle beamlets that are divergent upon exit from the aperture plate arrangement when an electrical field is generated in between the first and second multi aperture plates 120, 121.

Figure 15:
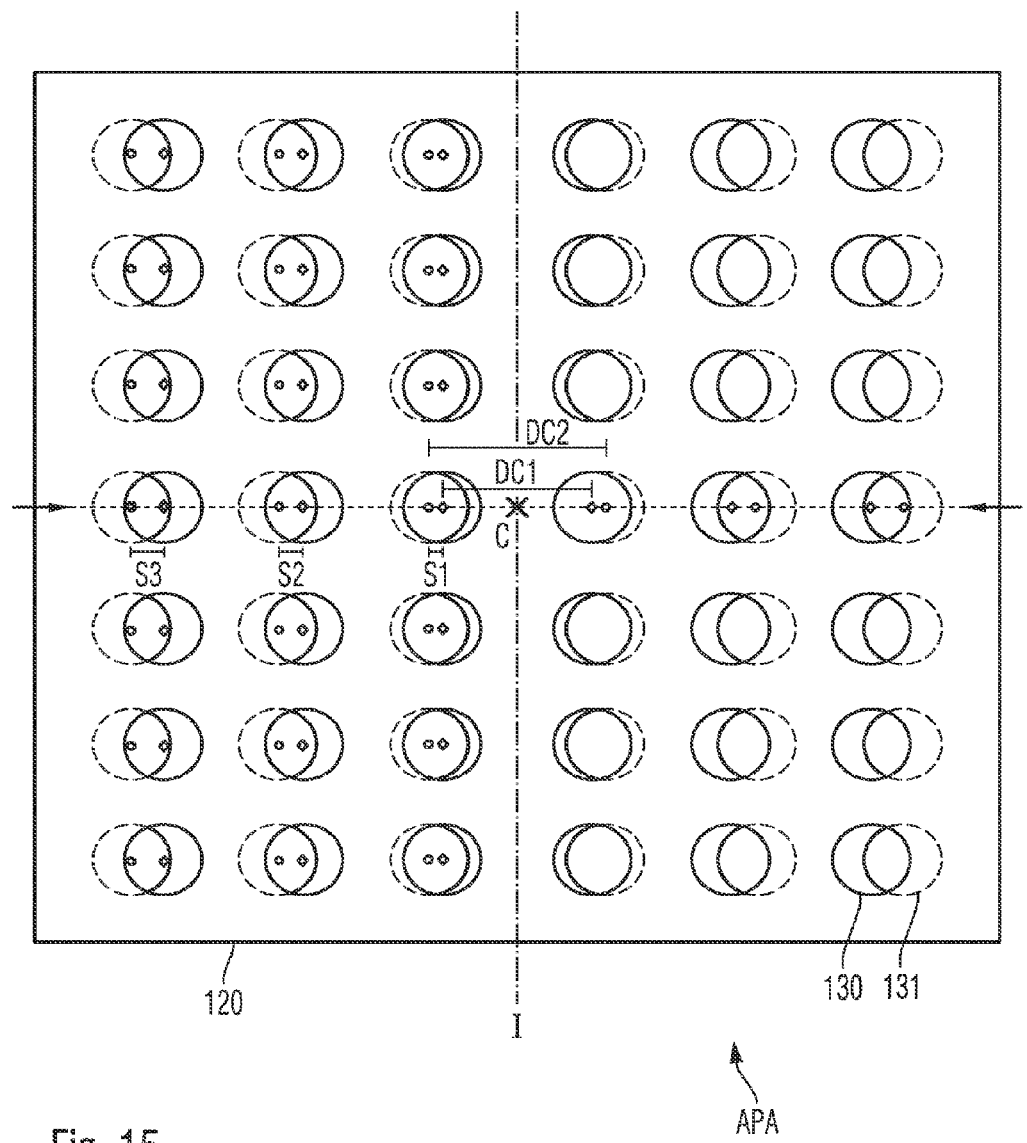
FIG. 15 shows an elevational view onto a first example of a pattern comprising the portion of the aperture plate arrangement shown in FIG. 14.
Figure 16:
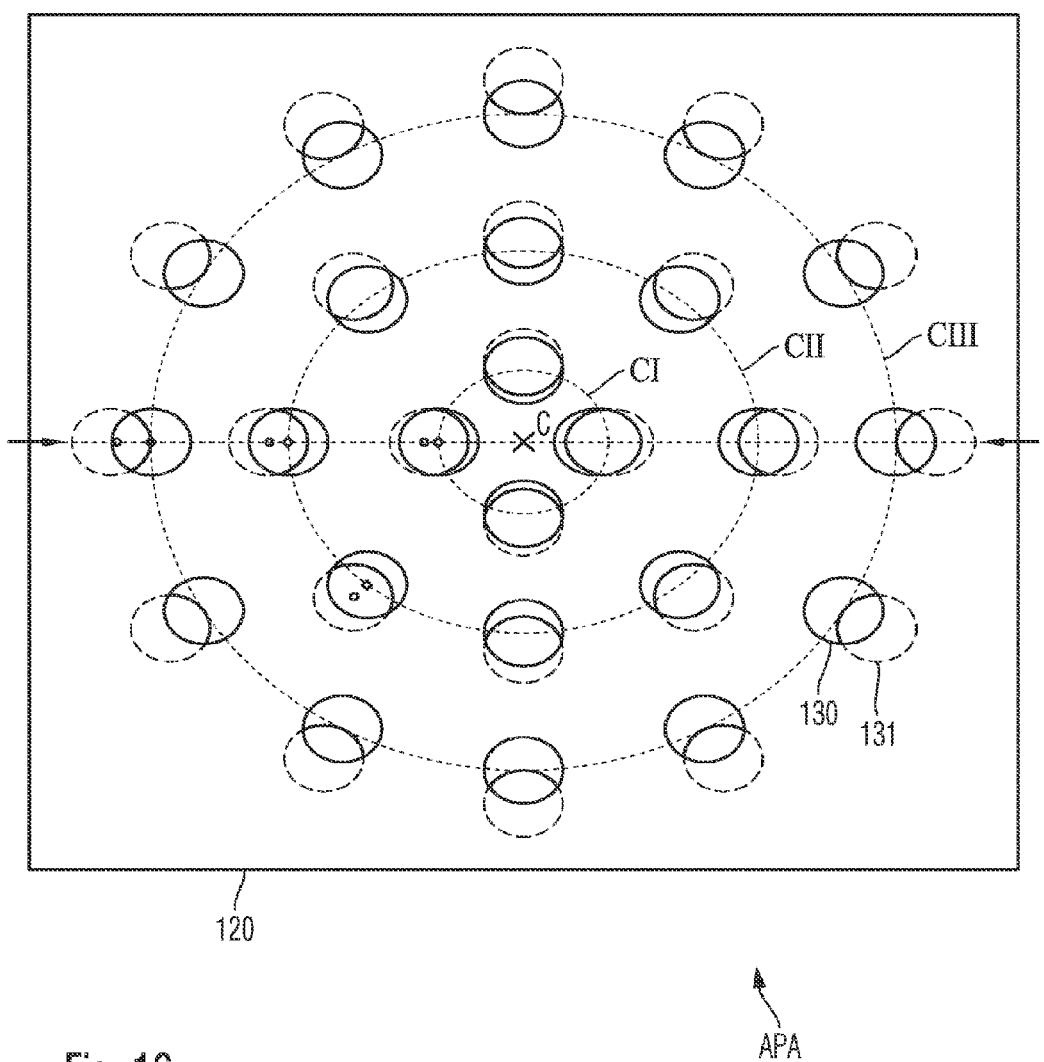
FIG. 16 shows an elevational view onto a second example of a pattern comprising the portion of the aperture plate arrangement shown in FIG. 14.

FIGS. 15 and 16 show two different examples of patterns of the apertures of the first and second multi aperture plates 120, 121. Symbols and reference numerals correspond to those of FIGS. 5 and 14, respectively. The row of apertures depicted in FIG. 14 forms part of the patterns illustrated in FIGS. 15 and 16, which differ by virtue of symmetry of the patterns. A position of row of FIG. 14 in the aperture plate arrangement APA is indicated by a dashed line and arrows to the left and right of the dashed line. The cross section shown in FIG. 13 is taken along this dashed line. In FIG. 15, the apertures 130 of the first multi aperture plate 121 form a highly symmetric first pattern wherein centers of apertures are arranged at equal distances DC1 in a rectangular array of rows and columns. A second pattern is formed by the apertures 131 of the second multi aperture plate. The second pattern differs from the first pattern in more than one respect: Firstly, it differs from the first pattern in that it comprises two mirror-inverted sub-arrays of apertures arranged in a rectangular grid of rows and columns. Two columns of apertures of the second pattern to the left and the right of an axis of mirror-inversion I have a distance DC2 from each other which is greater than a distance DC1 between the two associated columns of the first pattern which are arranged to the left and the right of the axis of mirror-inversion. In addition, with increasing distance from the axis I in either direction, the columns of apertures 131 in the second multi aperture plate are displaced by an increasing distance from associated apertures of the respective columns of apertures in the first multi aperture plate. The mirror-inverted symmetry of the second pattern results in displacement of associated apertures in the left half of the aperture plate arrangement, as depicted in FIG. 15, being to the left and displacement in the right half being to the right, i.e. in the opposite direction.

As illustrated in FIG. 16, the apertures 130, 131 of the first and second multi aperture plates form first and second patterns. Each pattern is radially symmetric about a center C of the first and second multi aperture plates. The aperture pairs may be grouped into a first group of aperture pairs arranged on a first (imaginary) circle CI about the center C, a second group of aperture pairs arranged on a larger, second (imaginary) circle CII about the center C and a third group of aperture pairs arranged on a still larger, third (imaginary) circle about the center C. A displacement distance S1, S2, S3, (as illustrated in FIG. 14) is a same displacement distance for all aperture pairs comprised in the same group of aperture pairs. In the depicted embodiment, the displacement distance increases from the first to the third group, i.e. it increases with increasing distance of the apertures of the respective group of aperture pairs from the center C.

Whilst in all embodiments comprising a blanking plate, the blanking plate has been shown to be arranged substantially in a focal plane of the charged particle beamlets, this is advantageous but it is to be noted that this is not necessary for carrying out the invention. The blanking plate may also be arranged in a different position relative to a focal plane, if any.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as defined in the following claims.

What is claimed is:

1. A charged particle beam system, comprising:
a charged particle source configured to generate a beam of charged particles;
a first field generating arrangement configured to generate at least one of a magnetic or electrostatic field extending over a space traversed by the beam of charged particles;
a beam stop disposed downstream of the first field generating arrangement, wherein the beam stop includes a multi aperture plate having a plurality of apertures formed therein;
a second field generating arrangement disposed downstream of the beam stop and configured to generate at least one of a magnetic or electrostatic field extending over a space traversed by the beam of charged particles; and
a controller configured to selectively switch the first and second field generating arrangements from a first mode of operation to a second mode of operation, wherein a first field of the first field generating arrangement associated with the first mode of operation is different from a second field of the first field generating arrangement associated with the second mode of operation, and wherein a first field of the second field generating arrangement associated with the first mode of operation is different from a second field of the second field generating arrangement associated with a second mode of operation;
wherein the first and second field generating arrangements, the beam stop, and the controller are arranged such that:
the beam of charged particles impinges onto the beam stop when the first and second field generating arrangements are switched to the first mode of operation, and
the beam of charged particles is deflected by the first field generating arrangement in a first direction, bypasses the beam stop, and is deflected by the second field generating arrangement in a second direction opposite the first direction to be incident on an object positioned downstream of the second field generating arrangement when the first and second field generating arrangements are switched to the second mode of operation; and
wherein the charged particle beam system further comprises a beam splitter and a detector arrangement, wherein the beam splitter is configured to separate a beam path of particles of the beam of charged particles travelling towards the object from electrons emerging from the object, and to direct the electrons emerging from the object towards the detector arrangement; and
wherein the charged particle beam system is configured to direct beamlets of the charged particles of the beam of charged particles traversing the apertures of the multi aperture plate onto a surface of the object and wherein the charged particle beam system is furthermore configured such that a first number of the beamlets are directed onto the object surface such that an array of beam spots are formed on the surface of the object when the field generating arrangement is switched to the first mode of operation.

2. The charged particle beam system of claim 1, further comprising an objective lens for focusing the beamlets onto the surface of the object.

3. The charged particle system according to claim 1, wherein the field generating arrangement comprises a single first pair of electrodes for generating the electrostatic field between the first pair of electrodes, wherein beam paths of all charged particles impinging onto the beam stop in the first mode of operation and bypassing the beam stop in the second mode of operation traverse a space between the single first pair of electrodes; and
wherein the controller is configured to selectively apply, in the first mode of operation, a first voltage difference to the first pair of electrodes to generate a first electrical field and, in the second mode of operation, a second voltage difference to the first pair of electrodes to generate a second electrical field.

4. The charged particle system according to claim 3, wherein an absolute value of the first voltage difference is less than an absolute value of the second voltage difference.

5. The charged particle system according to claim 3, wherein an absolute value of the second voltage difference is less than an absolute value of the first voltage difference.

6. The charged particle system according to claim 3, wherein the field generating arrangement further comprises at least one second pair of electrodes for generating the electrostatic field, wherein the second pair of electrodes is arranged downstream of the first pair of electrodes, and wherein the beam paths of the charged particles impinging onto the beam stop in the first mode of operation and bypassing the beam stop in the second mode of operation traverse a space between the at least one second pair of electrodes.

* * * * *